United States Patent
Tani et al.

(10) Patent No.: US 8,379,682 B2
(45) Date of Patent: Feb. 19, 2013

(54) NITRIDE SEMICONDUCTOR LASER CHIP AND METHOD OF FABRICATION THEREOF

(75) Inventors: Kentaro Tani, Osaka (JP); Toshiyuki Kawakami, Osaka (JP); Yoshihiko Tani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/067,747

(22) Filed: Jun. 23, 2011

(65) Prior Publication Data

US 2011/0317733 A1    Dec. 29, 2011

(30) Foreign Application Priority Data

Jun. 25, 2010    (JP) .................................. 2010-144660

(51) Int. Cl.
*H01S 3/04* (2006.01)

(52) U.S. Cl. .................................. 372/43.01; 372/45.01

(58) Field of Classification Search .............. 372/43.01, 372/45.01
See application file for complete search history.

(56) References Cited

U.S. PATENT DOCUMENTS

| | | | | |
|---|---|---|---|---|
| 2006/0126688 A1* | 6/2006 | Kneissl | ....................... | 372/43.01 |
| 2007/0217462 A1* | 9/2007 | Yamasaki | ................... | 372/46.01 |
| 2008/0089374 A1 | 4/2008 | Eichler et al. | | |
| 2008/0151952 A1* | 6/2008 | Takatani et al. | ................. | 372/36 |
| 2009/0290611 A1* | 11/2009 | Takiguchi et al. | ....... | 372/45.011 |
| 2010/0316082 A1* | 12/2010 | Kawaguchi et al. | ........ | 372/49.01 |

FOREIGN PATENT DOCUMENTS

| | | |
|---|---|---|
| JP | 11186650 A | 7/1999 |
| JP | 2002270967 A | 9/2002 |
| JP | 2005223148 A | 8/2005 |
| JP | 2008091910 A | 4/2008 |
| JP | 2010034246 A | 2/2010 |

* cited by examiner

*Primary Examiner* — Yuanda Zhang
(74) *Attorney, Agent, or Firm* — Harness, Dickey & Pierce, P.L.C.

(57) ABSTRACT

A nitride semiconductor laser chip that operates with reduced electric power consumption and helps achieve cost reduction has: an active layer formed of a nitride semiconductor; a nitride semiconductor layer formed above the active layer; a ridge portion formed in a part of the nitride semiconductor layer; and an electrically conductive film having a light-absorbing property and formed at least in a region outside the ridge portion above the nitride semiconductor layer. The ridge portion has a ridge width of 2 µm or more but 6 µm or less.

10 Claims, 15 Drawing Sheets

NITRIDE SEMICONDUCTOR LASER CHIP AND METHOD OF FABRICATION THEREOF

This nonprovisional application claims priority under 35 U.S.C. §119(a) on Patent Application No. 2010-144660 filed in Japan on Jun. 25, 2010, the entire contents of which are hereby incorporated by reference.

BACKGROUND OF THE INVENTION

1. Field of the Invention

The present invention relates to a nitride semiconductor laser chip and a method of fabrication thereof; in particular, the present invention relates to a ridge-waveguide type nitride semiconductor laser chip and a method of fabrication thereof.

2. Description of Related Art

As materials for light-emitting chips for use as short-wavelength light-emitting chips such as semiconductor laser chips and light-emitting diode (LED) chips, nitride semiconductor materials such as GaN have been researched and developed. Generally, GaN-based semiconductor laser chips using a nitride semiconductor material have a structure in which an InGaN layer is included in an active layer, and such laser chips are already in practical use as light sources for data reading in optical disc devices.

Nitride semiconductor laser chips for use in optical disc devices and the like usually have a ridge portion for confining light in the horizontal direction, and this ridge portion is formed to have a real index guide structure in which the ridge portion is buried under an insulating film such as a $SiO_2$ film.

Here, it is known that, in semiconductor laser chips, increasing the amount of electric current injected with a view to raising the optical output will cause the semiconductor laser chips to oscillate (lase) not only in the fundamental mode but also in higher-order modes. For this reason, in conventional nitride semiconductor laser chips, to suppress higher-order modes and for other purposes, the ridge portion is designed to have a ridge width as small as about 1.5 µm.

With a view to further suppressing higher-order modes, in other conventionally proposed semiconductor laser chips, a light absorption layer is formed in contact with a nitride semiconductor layer. Such nitride semiconductor laser chips are disclosed in, for example, JP-A-H11-186650, JP-A-2002-270967, JP-A-2005-223148, and JP-A-2008-91910.

In optical disc devices, laser light is shone on a disc, and the reflected light is received by a light-receiving element, and thereby the recorded information is read out. Here, for some reason, the reflected light may return to the semiconductor laser chip. If this returning light enters the active layer, the semiconductor laser chip will become unstable, causing fluctuation in light intensity and other inconveniences, thereby producing noise. For this reason, in cases where semiconductor laser chips are used in optical disc applications, they are driven by use of a high-frequency superimposition circuit as a measure against noise.

Inconveniently, however, with the conventional nitride semiconductor laser chips mentioned above, since they have high device resistances, unless high-frequency superimposition is applied amply, optical disc devices do not operate properly. Thus, a high-frequency superimposition circuit needs to be one that can drive a semiconductor laser chip at high frequency and large amplitude, and is therefore expensive. This, inconveniently, makes cost reduction difficult. Moreover, the high device resistances of the conventional nitride semiconductor laser chips require high operating voltages, and hence, inconveniently, lead to high electric power consumption.

On the other hand, in some conventionally proposed nitride semiconductor laser chips, to reduce the operating voltage, an electrode is formed so as to cover the top surface and side walls of the ridge portion. Such nitride semiconductor laser chips are disclosed in, for example, JP-A-2010-34246. In this nitride semiconductor laser chip, the electrode is formed so as to be electrically in contact with the side walls of the ridge portion but out of contact with the semiconductor layer in a side-bottom part of the ridge portion. With this structure, the electric charge resulting from spontaneous polarization and piezoelectric polarization of the nitride semiconductor layer is canceled out, and the operating voltage is reduced. JP-A-2010-34246 also discloses a structure in which the ridge portion is given a ridge width larger than 1.5 µm.

With the structures disclosed in JP-A-2010-34246 mentioned above, however, it is certainly possible to reduce the operating voltage, but, inconveniently, it is difficult to suppress higher-order modes. In particular, in cases where the ridge width is increased, higher-order modes are likely to occur, and this inconveniently tends to result in degraded device characteristics and lower reliability.

SUMMARY OF THE INVENTION

The present invention has been made to overcome the inconveniences discussed above, and an object of the invention is to provide a nitride semiconductor laser chip that operates with reduced electric power consumption and helps achieve cost reduction, and to provide a method of fabricating it.

Another object of the invention is to provide a nitride semiconductor laser chip with improved device characteristics and high reliability, and to provide a method of fabricating it.

To achieve the above objects, according to one aspect of the invention, a nitride semiconductor laser chip includes: an active layer formed of a nitride semiconductor; a nitride semiconductor layer formed above the active layer; a ridge portion formed in a part of the nitride semiconductor layer; and an electrically conductive film having a light-absorbing property and formed at least in a region outside the ridge portion above the nitride semiconductor layer. Here, the ridge portion has a ridge width of 2 µm or more but 6 µm or less.

In this nitride semiconductor laser chip according to the first aspect, by forming the electrically conductive film having a light-absorbing property at least in a region outside the ridge portion above the nitride semiconductor layer as described above, it is possible, owing to light absorption by the electrically conductive film, to suppress higher-order modes. This makes it possible, while suppressing higher-order modes, to increase the ridge width of the ridge portion.

Moreover, according to the first aspect, by giving the ridge portion a ridge width of 2 µm or more but 6 µm or less, it is possible to reduce the device resistance. Thus, in a case where the nitride semiconductor laser chip is used in an optical disc device, it is possible to reduce the resistance of the optical disc device during operation (during playback operation). Thus, in a case where the semiconductor laser chip is driven by use of a high-frequency superimposition circuit, it is possible to make application of high-frequency superimposition easier, and thus it is possible to drive it by use of an inexpensive high-frequency superimposition circuit. Thus, by using an inexpensive high-frequency superimposition circuit, it is possible to achieve cost reduction.

Moreover, by reducing the device resistance, it is also possible to reduce the operating voltage, and this makes it possible to reduce electric power consumption.

Furthermore, according to the first aspect, by suppressing higher-order modes, even when the ridge portion is given an increased ridge width, it is possible to realize stable lateral mode control. In addition, it is possible to suppress development of a kink. This makes it possible to improve device characteristics and reliability.

Here, the "ridge width" denotes, in a case where the ridge portion has a substantially trapezoidal sectional shape, its width along the bottom edge.

In the nitride semiconductor laser chip according to the first aspect described above, the electrically conductive film may be formed so as to cover the region outside the ridge portion above the nitride semiconductor layer and the side surface of the ridge portion. With this structure, it is possible to effectively suppress higher-order modes, and thus it is possible, while suppressing higher-order modes, to easily increase the ridge width of the ridge portion. Here, to "cover" includes covering part of the region outside the ridge portion above the nitride semiconductor layer and the side surface of the ridge portion.

In the nitride semiconductor laser chip according to the first aspect described above, preferably, the nitride semiconductor layer is formed of a p-type nitride semiconductor, and the carrier concentration on the surface of the nitride semiconductor layer at the side surface of the ridge portion and the carrier concentration on the surface of the nitride semiconductor layer in the region outside the ridge portion are each $1 \times 10^{17}$ cm$^{-3}$ or less. With this structure, it is possible to put the electrically conductive film in non-ohmic contact with the region outside the ridge portion above the nitride semiconductor layer and the side surface of the ridge portion. Thus, even though the electrically conductive film is in contact with the nitride semiconductor layer, it is possible to suppress passage of electric current across the contact region, and thus to suppress leak current.

In that case, it is preferable that the carrier concentration on the surface of the nitride semiconductor layer at the side surface of the ridge portion and the carrier concentration on the surface of the nitride semiconductor layer in the region outside the ridge portion be each $1 \times 10^{16}$ cm$^{-3}$ or less. With this structure, it is possible to suppress leak current more effectively.

In the nitride semiconductor laser chip according to the first aspect described above, the electrically conductive film may have a thickness of 15 nm or more but 100 nm or less.

In the nitride semiconductor laser chip according to the first aspect described above, it is preferable that the electrically conductive film be formed of a material containing at least one element selected from the group consisting of Ti, Mo, Ni, Cr, Cu, Fe, Zr, Hf, Nb, W, Rh, Ru, Mg, Si, Al, Sc, Y, Ta, Co, Pd, Ag, Au, and Pt. With this structure, it is possible to effectively achieve light confinement by light absorption, and thus it is possible, while suppressing higher-order modes, to more easily increase the ridge width of the ridge portion.

In the nitride semiconductor laser chip according to the first aspect described above, preferably, on the electrically conductive film, an insulating film is formed and, via this the insulating film, the electrode layer is formed above the electrically conductive film. With this structure, it is possible to improve the electrostatic withstand voltage, and thus to improve reliability. Moreover, it is possible to reduce variations within a lot, and thus to obtain chips with high reliability at high yields. It is preferable that the insulating film be given a thickness of 100 nm or more. By forming the insulating film with a thickness of 100 nm or more in this way, it is possible to obtain a higher withstand voltage.

In that case, it is preferable that the insulating film be an oxide or nitride of Ti, Si, Zr, or Al.

In the nitride semiconductor laser chip according to the first aspect described above, it is preferable that the nitride semiconductor layer be doped with Mg as a p-type dopant.

In that case, preferably, the surface of the nitride semiconductor layer is supplied with hydrogen, and the hydrogen concentration on the surface of the nitride semiconductor layer at the side surface of the ridge portion and the hydrogen concentration on the surface of the nitride semiconductor layer in the region outside the ridge portion are each $1 \times 10^{18}$ cm$^{-3}$ or more. With this structure, it is possible to easily make the carrier concentration on the surface of the nitride semiconductor layer at the side surface of the ridge portion and the carrier concentration on the surface of the nitride semiconductor layer in the region outside the ridge portion equal to $1 \times 10^{17}$ cm$^{-3}$ or less.

In the structure described above in which a region where the carrier concentration is $1 \times 10^{17}$ cm$^{-3}$ or less is formed on the surface of the nitride semiconductor layer, preferably, the region in the ridge portion where the carrier concentration on the surface of the nitride semiconductor layer is $1 \times 10^{17}$ cm$^{-3}$ or less has a width of 2 μm or less, or 25% or less of the ridge width. With this structure, it is possible to form a saturable absorption region in the active layer, and thus it is possible to let the nitride semiconductor laser chip oscillate by self-excitation. This eliminates the need for a high-frequency superimposition circuit, and thus helps achieve further cost reduction.

According to a second aspect of the invention, a method of fabricating a nitride semiconductor laser chip includes: a step of forming a p-type nitride semiconductor layer above an active layer formed of a nitride semiconductor; a step of forming a ridge portion in a part of the nitride semiconductor layer; a step of supplying hydrogen to the surface of the nitride semiconductor layer at the side surface of the ridge portion and to the surface of the nitride semiconductor layer in a region outside the ridge, portion; and a step of forming an electrically conductive film having a light-absorbing property at least in the region outside the ridge portion above the nitride semiconductor layer. Here, the step of forming the p-type nitride semiconductor layer includes a step of doping with Mg as a p-type dopant, and the step of forming the ridge portion includes a step of giving the ridge portion a ridge width of 2 μm or more but 6 μm or less.

According to the second aspect, by forming the electrically conductive film having a light-absorbing property at least in a region outside the ridge portion above the nitride semiconductor layer as described above, it is possible, owing to light absorption by the electrically conductive film, to suppress higher-order modes. This makes it possible, while suppressing higher-order modes, to increase the ridge width of the ridge portion.

Moreover, according to the second aspect, by supplying hydrogen to the surface of the nitride semiconductor layer at the side surface of the ridge portion and to the surface of the nitride semiconductor layer in a region outside the ridge portion, it is possible to lower the carrier concentration in that region. Thus, even though the electrically conductive film and the nitride semiconductor layer are in contact with each other, it is possible to suppress leak current.

Furthermore, according to the second aspect, by giving the ridge portion a ridge width of 2 μm or more but 6 μm or less, it is possible to reduce the device resistance.

In the method of fabricating a nitride semiconductor laser chip according to the second aspect described above, preferably, the step of supplying hydrogen to the surface of the nitride semiconductor layer includes a step of supplying radical hydrogen to the surface of the nitride semiconductor layer from a radical hydrogen source. With this scheme, it is possible to easily supply hydrogen to the surface of the nitride semiconductor layer, and thus to easily make the hydrogen concentration on the surface of the nitride semiconductor layer equal to $1\times10^{18}$ cm$^{-3}$ or more. This makes it possible to easily make the carrier concentration on the surface of the nitride semiconductor layer at the side surface of the ridge portion and the carrier concentration on the surface of the nitride semiconductor layer in the region outside the ridge portion equal to $1\times10^{17}$ cm$^{-3}$ or less. By forming a metal layer of Pd, W, Ti, Ni, or the like above the ridge portion, it is possible to form, by using the metal layer as a mask, a region where the p-type carrier concentration is $1\times10^{17}$ cm$^{-3}$ or less wherever necessary.

In the method of fabricating a nitride semiconductor laser chip according to the second aspect described above, the step of supplying hydrogen to the surface of the nitride semiconductor layer may include a step of implanting hydrogen into the surface of the nitride semiconductor layer. Also in this case, by forming a metal layer of Pd, W, Ti, Ni, or the like above the ridge portion, it is possible to form, by using the metal layer as a mask, a region where the p-type carrier concentration is $1\times10^{17}$ cm$^{-3}$ or less wherever necessary.

As described above, according to the present invention, it is possible to easily obtain a nitride semiconductor laser chip that operates with reduced electric power consumption and helps achieve cost reduction, and a method of fabricating it.

Moreover, according to the present invention, it is possible to easily obtain a nitride semiconductor laser chip with improved device characteristics and high reliability, and a method of fabricating it.

DETAILED DESCRIPTION OF PREFERRED EMBODIMENTS

Hereinafter, embodiments of the present invention will be described with reference to the accompanying drawings.

Embodiment 1

Figure 1:
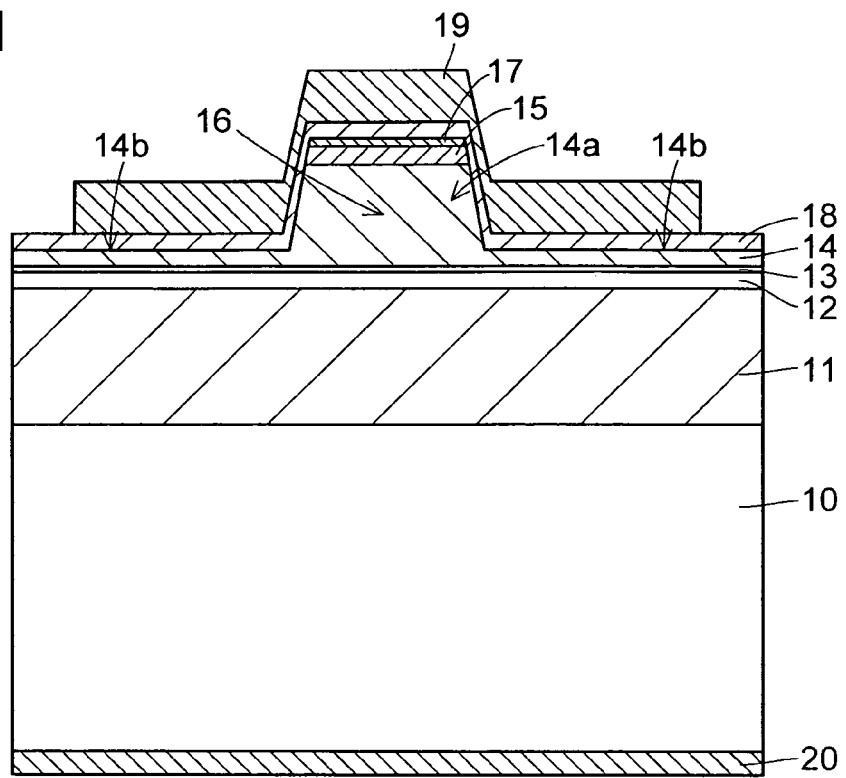
FIG. 1 is a sectional view of a nitride semiconductor laser chip according to Embodiment 1 of the invention (a diagram corresponding to the section along line A-A in FIG. 3)
Figure 2:
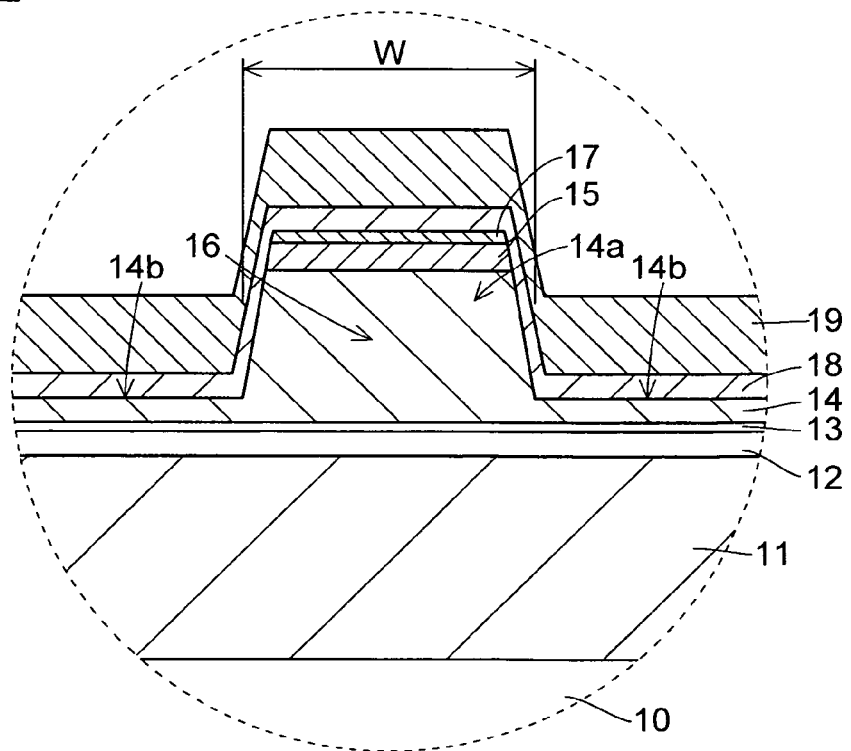
FIG. 2 is a sectional view of the nitride semiconductor laser chip according to Embodiment 1 of the invention (an enlarged sectional view of part of FIG. 1)
Figure 3:
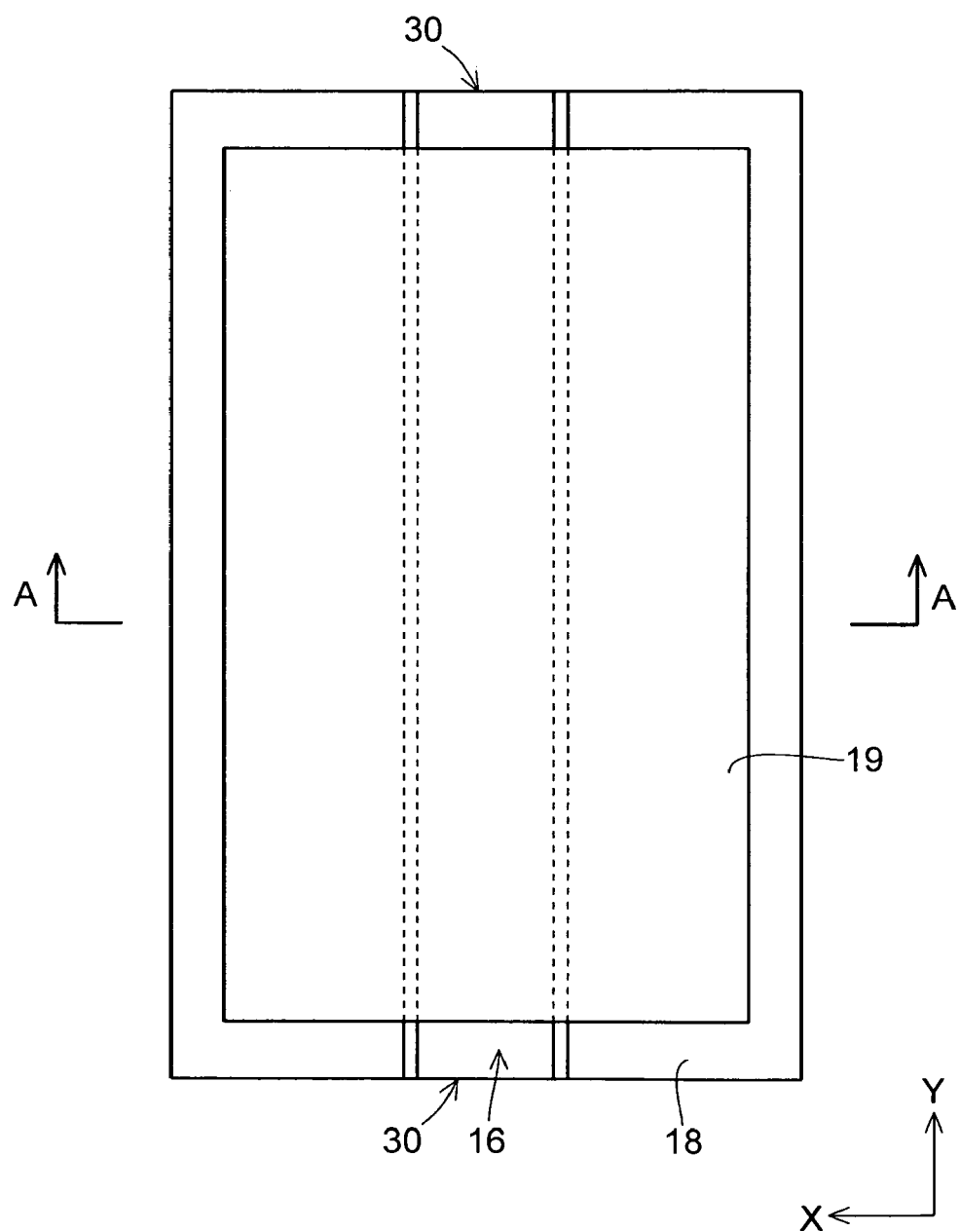
FIG. 3 is a plan view of the nitride semiconductor laser chip according to Embodiment 1 of the invention.

FIGS. 1 and 2 are sectional views of a nitride semiconductor laser chip according to a first embodiment (Embodiment 1) of the invention. FIG. 3 is a plan view of the nitride semiconductor laser chip according to Embodiment 1 of the invention. FIG. 1 shows a section along line A-A in FIG. 3, and FIG. 2 shows an enlarged section of part of FIG. 1. First, with reference to FIGS. 1 to 3, the structure of the nitride semiconductor laser chip according to Embodiment 1 of the invention will be described.

As shown in FIG. 1, in the nitride semiconductor laser chip according to Embodiment 1, on an n-type GaN substrate 10, an n-type clad layer 11 of n-type AlGaN with a thickness of, for example, about 2 μm to about 3 μm is formed. On the n-type clad layer 11, an active layer 12 having a quantum well structure is formed. The active layer 12 has a total thickness of, for example, about 0.1 μm to about 0.3 μm, and is composed of GaN barrier layers and InGaN well layers stacked alternately.

On the active layer 12, an AlGaN evaporation prevention layer 13 with a thickness of, for example, about 5 nm to about 30 nm is formed. On the AlGaN evaporation prevention layer 13, a p-type clad layer 14 of p-type AlGaN is formed, which has an elevated portion 14a and, elsewhere than there, a flat portion 14b. On the elevated portion 14a of the p-type clad layer 14, a p-type contact layer 15 of p-type GaN with a thickness of, for example, about 0.05 μm to about 0.2 μm is formed. As shown in FIGS. 1 and 2, the p-type contact layer 15 and the elevated portion 14a of the p-type clad layer 14 together constitute a stripe-shaped (elongate) ridge portion 16 with a ridge width W of 2 μm or more but 6 μm or less. Specifically, in Embodiment 1, the ridge portion 16 is given a ridge width W of 3 μm. As shown in FIG. 3, the ridge portion 16 is formed so as to extend in the resonator (cavity) direction (the Y-direction). The p-type semiconductor layers are doped with Mg as a p-type dopant. The p-type clad layer 14 and the p-type contact layer 15 are each an example of a "nitride semiconductor layer" according to the invention. The flat portion 14b of the p-type clad layer 14 may be considered to be an extension portion thereof that extends sideways (in the X-direction in FIG. 3) from the ridge portion 16.

As shown in FIGS. 1 and 2, on the p-type contact layer 15, a contact electrode 17 with a thickness of, for example, about 0.01 μm to about 0.1 μm is formed. The contact electrode 17 is formed of, for example, Ni, Ti, Pd, or the like.

Here, in Embodiment 1, across the entire surface over the p-type clad layer 14, an electrically conductive film 18 having a light-absorbing property is formed. Specifically, the electrically conductive film 18 is formed so as to cover the top surface of the ridge portion 16 (over the contact electrode 17), the side surface of the ridge portion 16, and the region outside the ridge portion 16 (over the flat portion 14b of the p-type clad layer 14). The electrically conductive film 18 is formed of, for example, Ti, Pd, Ni, W, Mo, or the like. It is preferable that the electrically conductive film 18 be given a thickness of 10 nm or more but 200 nm or less, and further preferably 15 nm or more but 100 nm or less.

Moreover, in Embodiment 1, the electrically conductive film 18 is formed so as to be in contact with the p-type clad layer 14. Specifically, the p-type clad layer 14 is configured to have a carrier concentration of about $1 \times 10^{17}$ cm$^{-3}$, and the electrically conductive film 18 is in non-ohmic contact with the p-type clad layer 14. On the other hand, the p-type contact layer 15 has a higher Mg concentration than the p-type clad layer 14, and accordingly has a carrier concentration of, for example, $1 \times 10^{18}$ cm$^{-3}$ or more. Thus, the electrically conductive film 18 is in ohmic contact with the p-type contact layer 15 via the contact electrode 17.

On the electrically conductive film 18, there is formed a p-side pad electrode 19 for injection of carriers from over the ridge portion 16. As shown in FIGS. 1 to 3, the p-side pad electrode 19 is formed so as to cover part of the contact electrode 17 formed on the ridge portion 16. In its portion covering part of the contact electrode 17, the p-side pad electrode 19 is in indirect contact with the contact electrode 17 via the electrically conductive film 18. Moreover, the p-side pad electrode 19 has a multiple-layer structure in which a Ti layer (not shown) and a Au layer (not shown) are stacked sequentially from the electrically conductive film 18 side, and is formed to have a total thickness of, for example, about 0.1 μm to about 2 μm. The p-side pad electrode 19 is an example of an "electrode layer" according to the invention.

On the other hand, as shown in FIG. 1, on the bottom surface of the n-type GaN substrate 10, there is formed an n-side electrode 20 for injection of carriers from under the substrate. The n-side electrode 20 has a multiple-layer structure in which, for example, a Ti layer (not shown), a Pt layer (not shown), and a Au layer (not shown) are sequentially stacked from the n-type GaN substrate 10's bottom surface side, and is in ohmic contact with the n-type GaN substrate 10.

Moreover, as shown in FIG. 3, the nitride semiconductor laser chip according to Embodiment 1 has a pair of resonator (cavity) facets 30, which includes a light exit surface through which laser light is emitted and a light reflection surface opposite from the light exit surface. On these resonator facets 30, a protective coating film (not shown) of an insulating material is formed.

Forming the protective coating film out of an insulating material with an extinction coefficient of $10^{-4}$ or less for light of a wavelength of 400 nm makes it possible to optimally control the reflectance of the protective coating film at the resonator facets 30. Usable materials for the protective coating film include $ZrO_2$, $SiO_2$, $Al_2O_3$, $HfO_2$, CaF, $Na_3AlF_6$, LiF, $LaF_3$, $CeF_3$, $MgF_2$, $NdF_3$, and AlN. The coating of the resonator facets 30 with the protective coating film may be done not only for reflectance control but also for facet protection.

Forming the protective coating film on the resonator facets 30 as described above serves not only to prevent facet deterioration but also to improve other device characteristics such as the threshold value and the slope efficiency. It is preferable that the protective coating film be configured to include, as the first layer in contact with the semiconductor layer, a layer that is formed of AlON and that has an oxygen concentration in the range of 1% to 30% and a thickness of 100 nm or less.

As described above, the nitride semiconductor laser chip according to Embodiment 1 has an index guide structure. It should be noted, however, that, as distinct from semiconductor laser chips having a real index guide structure in which the ridge portion is buried under an insulating film of $SiO_2$ or the like, the nitride semiconductor laser chip according to Embodiment 1 has the ridge portion 16 buried under the electrically conductive film 18. In this respect, the nitride semiconductor laser chip according to Embodiment 1 can be said to have a loss index guide structure; however, the electrically conductive film 18 here is given a smaller thickness than in a loss index guide structure, resulting in lower internal loss. Thus, the nitride semiconductor laser chip described above can be said to have an intermediate structure (loss-real index guide structure) between a real index guide structure and a loss index guide structure.

As described above, in Embodiment 1, by forming the electrically conductive film 18 having a light-absorbing property on the p-type clad layer 14, it is possible, owing to light absorption by the electrically conductive film 18, to confine light in the lateral direction and to suppress higher-order modes. This makes it possible, while suppressing higher-order modes, to increase the ridge width W of the ridge portion 16. Optimized crystal growth conditions result in improved light emission efficiency in the active layer 12, and thus even with an increased ridge width, it is possible to prevent an increase in the operating current.

Moreover, in Embodiment 1, by giving the ridge portion 16a ridge width W of 2 μm or more but 6 μm or less (about 3 μm), it is possible to reduce the device resistance. Thus, in a case where the nitride semiconductor laser chip is used in, for example, an optical disc device, it is possible to reduce the resistance of the optical disc device during operation (during playback operation). Thus, in a case where the semiconductor laser chip is driven by use of a high-frequency superimposition circuit, it is possible to make application of high-frequency superimposition easier, and thus it is possible to drive it by use of an inexpensive high-frequency superimposition circuit. By using an inexpensive high-frequency superimposition circuit, it is possible to achieve cost reduction.

Moreover, in Embodiment 1, by reducing the device resistance, it is possible to reduce the operating voltage, and thus it is also possible to reduce electric power consumption.

Furthermore, in Embodiment 1, by suppressing higher-order modes, even when the ridge portion 16 is given an increased ridge width W, it is possible to realize stable lateral mode control. In addition, it is possible to suppress development of a kink. This makes it possible to improve device characteristics and reliability.

Moreover, as described above, by forming the electrically conductive film 18 so as to cover the region outside the ridge portion 16 on the p-type clad layer 14 (over the flat portion 14b of the p-type clad layer 14) and the side surface of the ridge portion 16, it is possible to effectively suppress higher-order modes, and thus it is possible, while suppressing higher-order modes, to easily increase the ridge width W of the ridge portion 16.

Since the electrically conductive film 18 is in non-ohmic contact with the p-type clad layer 14, even though the electrically conductive film 18 is in contact with the p-type clad layer 14 as described above, it is possible to suppress passage of electric current across the contact region. Thus, it is possible to suppress leak current.

FIGS. 4 to 8 are sectional views illustrating a method of fabricating the nitride semiconductor laser chip according to Embodiment 1 of the invention. Next, with reference to FIGS. 1 and 3 to 8, a method of fabricating the nitride semiconductor laser chip according to Embodiment 1 of the invention will be described.

Figure 4:
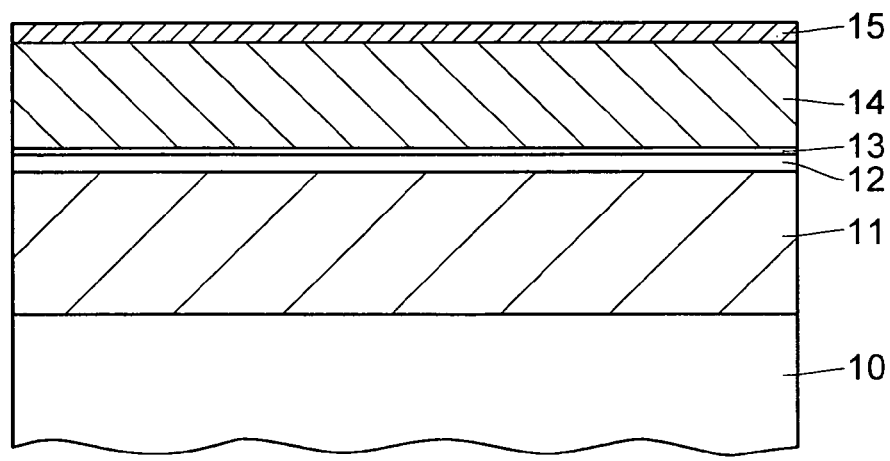
FIG. 4 is a sectional view illustrating a method of fabricating the nitride semiconductor laser chip according to Embodiment 1 of the invention.

First, as shown in FIG. 4, by an MOCVD (metal organic chemical vapor deposition) process, on the n-type GaN substrate 10, nitride semiconductor layers 11 to 15 are grown sequentially. Specifically, on the n-type GaN substrate 10, the following layers are grown sequentially: an n-type clad layer 11 of n-type AlGaN with a thickness of about 2 μm to about 3 μm; an active layer 12 having a quantum layer structure; an AlGaN evaporation prevention layer 13 with a thickness of about 5 nm to about 30 nm; a p-type clad layer 14 of p-type AlGaN with a thickness of about 0.3 μm to about 0.7 μm; and a p-type contact layer 15 of p-type GaN with a thickness of about 0.05 μm to about 0.2 μm.

When p-type semiconductor layers are grown, they are doped with Mg as a p-type dopant. The p-type clad layer 14 is formed to have a carrier concentration of about $1\times10^{17}$ cm$^{-3}$, and the p-type contact layer 15 is formed to have a carrier concentration of about $1\times10^{18}$ cm$^{-3}$. As an n-type dopant, for example, Si can be used.

Figure 5:
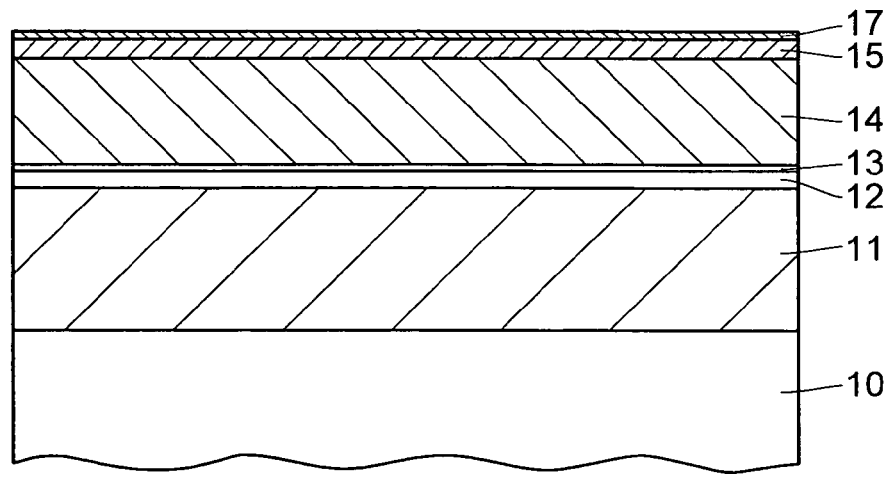
FIG. 5 is a sectional view illustrating the method of fabricating the nitride semiconductor laser chip according to Embodiment 1 of the invention.

Next, as shown in FIG. 5, on the p-type contact layer 15, by a vacuum evaporation process or the like, a contact electrode 17 formed predominantly of Ni, Ti, Pd, or the like with a thickness of about 0.01 μm to about 0.1 μm is formed. Then, the electrode is alloyed at high temperature to produce ohmic contact between the p-type contact layer 15 and the contact electrode 17.

Figure 6:
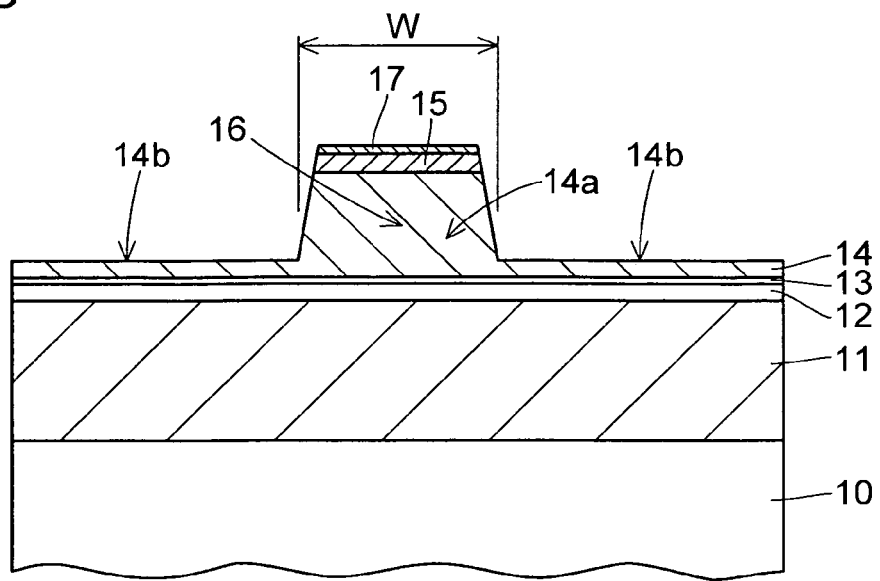
FIG. 6 is a sectional view illustrating the method of fabricating the nitride semiconductor laser chip according to Embodiment 1 of the invention.

Subsequently, as shown in FIG. 6, by a photolithography technology and a dry-etching technology such as reactive ion etching (RIE) or otherwise, selective etching is performed from the top surface of the contact electrode 17 halfway into the depth of the p-type clad layer 14. This forms a stripe-shaped ridge portion 16 which is composed of an elevated portion 14a of the p-type clad layer 14 and the p-type contact layer 15, which has a ridge width W of about 3 μm, and which extends in the resonator direction (the Y direction; see FIG. 3), in practice a plurality of such ridge portions being formed parallel to one another.

Figure 7:
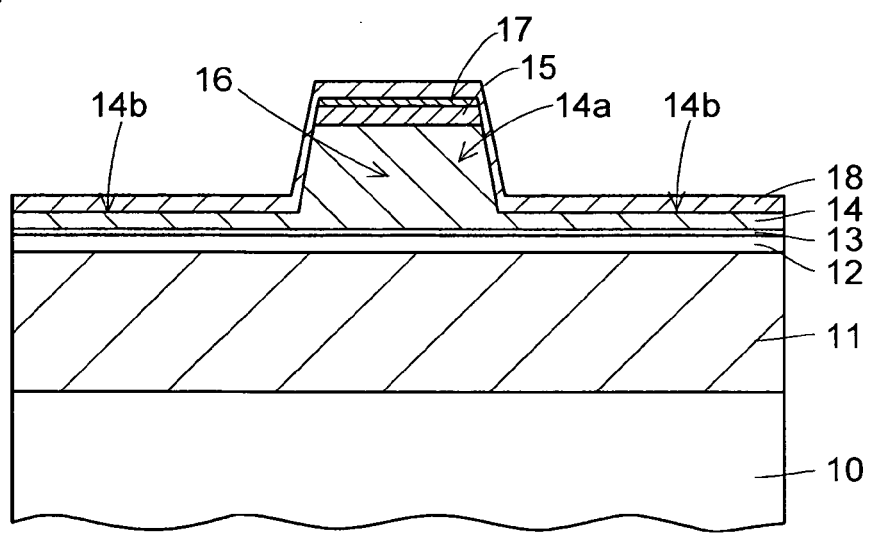
FIG. 7 is a sectional view illustrating the method of fabricating the nitride semiconductor laser chip according to Embodiment 1 of the invention.

Thereafter, as shown in FIG. 7, by a sputtering process or an electron beam evaporation process, an electrically conductive film 18 is formed so as to cover the top surface of the ridge portion 16 (over the contact electrode 17), the side surface of the ridge portion 16, and the region outside the ridge portion 16 (over the flat portion 14b of the p-type clad layer 14). That is, across the entire surface over the p-type clad layer 14, the electrically conductive film 18 is formed in direct contact with the p-type clad layer 14. The electrically conductive film 18 is formed of, for example, Ti, Pd, Ni, W, Mo, or the like, and is given a thickness of, for example, about 10 nm to about 20 nm.

Figure 8:
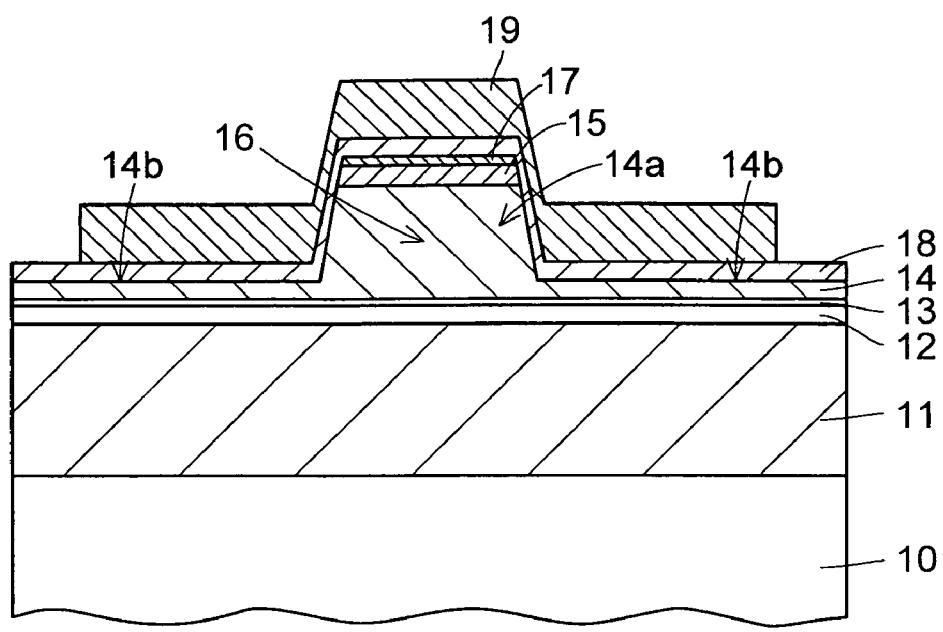
FIG. 8 is a sectional view illustrating the method of fabricating the nitride semiconductor laser chip according to Embodiment 1 of the invention.

Next, as shown in FIG. 8, by an electron beam evaporation process, a sputtering process, a plating process, or the like, on the electrically conductive film 18, a Au layer is formed as a p-side pad electrode 19. The p-side pad electrode 19 is formed in, for example, a substantially rectangular shape as seen in a plan view, in practice a plurality of such p-side pad electrodes being formed in the shape of a matrix.

Next, for easy splitting of the substrate (wafer), the bottom surface of the n-type GaN substrate 10 is ground or polished to reduce the thickness of the n-type GaN substrate 10. Then, the ground or polished surface is treated by dry etching or the like for surface trimming.

Subsequently, as shown in FIG. 1, on the ground or polished bottom surface of the n-type GaN substrate 10, by a sputtering process, an electron beam evaporation process, or the like, an n-side electrode 20 having a multiple-layer structure is formed by sequentially forming, for example, a Ti layer (not shown), a Pt layer (not shown), and a Au layer (not shown) from the n-type GaN substrate 10's bottom surface side. Then, the electrode is alloyed at high temperature to produce ohmic contact between it and the n-type GaN substrate 10.

The substrate (wafer) formed as described above is then, on a scribing machine, split (cleft) in the resonator direction (the direction perpendicular to the ridge portion 16) into bars. Then, on both the front and rear facets (resonator facets) of each split bar, by a process such as an evaporation process or a sputtering process, a protective coating film of an insulating material such as AlON or $Al_2O_3$ is formed.

Lastly, each bar is split into individual semiconductor laser chips. In this way, the nitride semiconductor laser chip shown in FIG. 1 according to Embodiment 1 of the invention is fabricated.

The nitride semiconductor laser chip fabricated in this way is then mounted on a stem via a sub-mount of AlN, SiC, or the like, and is electrically connected to lead pins via wires. A cap is then welded on the stem, and this completes the assembly of a can-package semiconductor laser device.

Next, experiments conducted to verify the benefits of the embodiment described above will be described. In these experiments, first, to investigate the influence of the ridge width on the incidence of a kink, a plurality of nitride semiconductor laser chips with different ridge widths were fabricated, and for the chips of each ridge width, the incidence of a kink was measured.

In addition, while nitride semiconductor laser chips similar to that of Embodiment 1 described above were taken as Practical Example 1, nitride semiconductor laser chips having a conventional structure (chips having a real index guide structure in which the ridge portion is buried under an insulating film of $SiO_2$ or the like) were taken as Comparative Example. For both Practical Example 1 and Comparative Example, chips were fabricated with varying ridge widths. For each ridge width, 10 to 20 chips were fabricated and subjected to the measurement. Chips of Comparative Example were fabricated so as to have the same structure as those of Practical Example 1 except that, in the former, the ridge portion is buried under an insulating film as distinct from the electrically conductive film in the latter.

Next, chips of Practical Example 1 and Comparative Example were driven with pulses to measure the relationship between the light output and the injected electric current (L-I response). Then, by checking whether a kink developed or not based on the L-I response, the incidence of a kink was determined for the chips of each ridge width. The light output was 30 mW, and the pulses had a width of 0.5 us and a duty cycle of 50%. The results are shown in FIG. 9.

Figure 9:
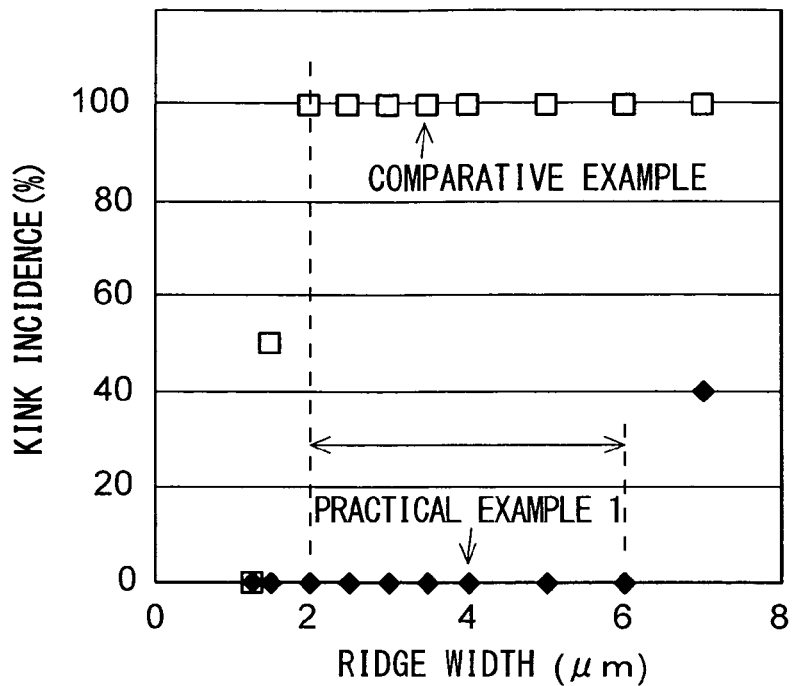
FIG. 9 is a correlation chart showing the relationship between ridge width and kink incidence.

FIG. 9 is a correlation chart showing the relationship between the ridge width and the kink incidence. In FIG. 9, the horizontal axis represents the ridge width (μm) in nitride semiconductor laser chips, and the vertical axis represents the kink incidence (%). The kink incidence is the incidence of a kink within each production lot.

As shown in FIG. 9, in Practical Example 1 (indicated by solid black rhombi), no development of a kink was recognized with ridge widths of 6 μm or less. By contrast, in Comparative Example (indicated by hollow squares), a kink developed in all the chips with ridge widths of 2 μm or more. It is considered that, in Comparative Example, as the ridge width increased (2 μm or more), higher-order modes occurred, and this resulted in the kink incidence of 100%. On the other hand, it is considered that, in Practical Example 1, even when the ridge width was increased, light absorption by the electrically conductive film suppressed higher-order modes, and this prevented development of a kink. Thus, it was confirmed that, by forming an electrically conductive film over a p-type clad layer, it is possible, while suppressing higher-order modes (a kink), to increase the ridge width.

Next, to investigate the influence of the ridge width on the operating resistance of an optical disc device, by use of nitride semiconductor laser chips of Practical Example 1 with varying ridge widths, the operating resistance of an optical disc device was measured. The results are shown in FIG. 10.

Figure 10:
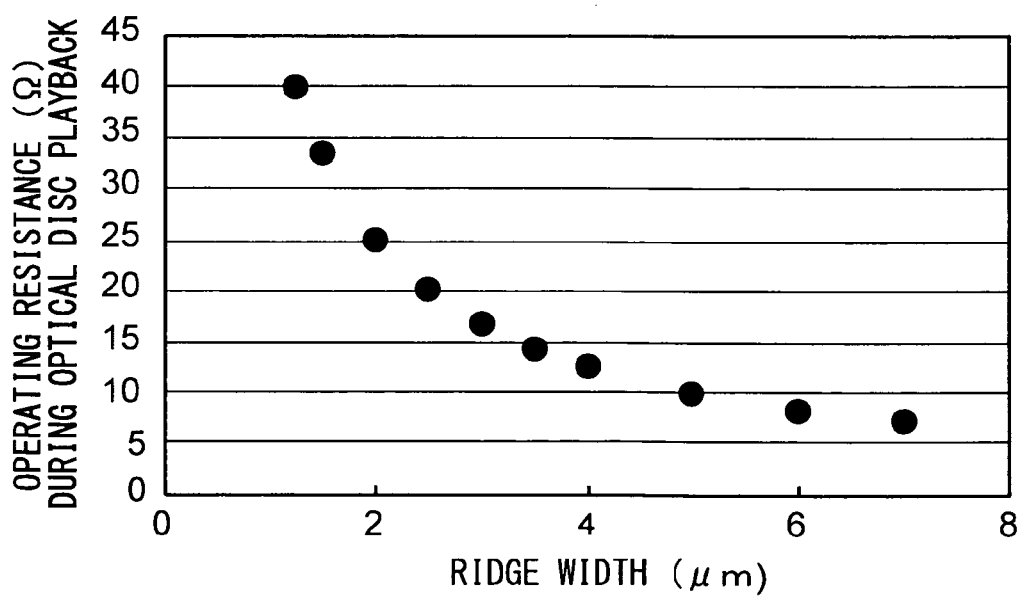
FIG. 10 is a correlation chart showing the relationship between ridge width and the operating resistance of an optical disc device.

FIG. 10 is a correlation chart showing the relationship between the ridge width and the operating resistance of an optical disc device. In FIG. 10, the horizontal axis represents the ridge width (μm) in nitride semiconductor laser chips, and the vertical axis represents the resistance (Ω) of an optical disc device during operation (during playback from an optical disc).

It is understood from FIG. 10 that, as the ridge width increases, the operating resistance decreases. It is also seen that the rate of decrease of the operating resistance tends to be higher with smaller ridge widths and lower with larger ridge widths. That is, while adopting a ridge width of 2 μm or more makes it possible to effectively reduce the operating resistance, increasing the ridge width over 6 μm does not produce a significant change in the operating resistance compared with that when the ridge width equals 6 μm. Thus, to suppress development of a kink and in addition effectively reduce the operating resistance, it is preferable to adopt a ridge width of 2 μm or more but 6 μm or less.

In nitride semiconductor laser chips, due to the high resistivity of p-type semiconductor layers, adopting a ridge width of about 1.5 μm as in conventional nitride semiconductor laser chips result in high device resistances. Here, in conventional chips, it is difficult to increase the ridge width because doing so will cause higher-order modes to occur. By contrast, in Embodiment 1, it is possible, while suppressing higher-order modes, to increase the ridge width, and thus it is possible to reduce the device resistance.

Moreover, by a fabrication method similar to that of Embodiment 1 described above, nitride semiconductor laser chips similar to that of Embodiment 1 were fabricated with a ridge width of about 3 μm, and their device characteristics were measured. These chips, compared with conventional chips with a ridge width of 1.5 μm, achieved an about 50% reduction in the operating resistance of an optical disc device and an about 10% reduction in the operating voltage. As a result, application of high-frequency superimposition was easier, and the cost of the high-frequency superimposition circuit was lower. Moreover, noise characteristics had less variations, and the cost of the optical pickup system was lower. Furthermore, the lateral mode of laser light was confined by the electrically conductive film of Ti, Pd, Ni, W, Mo, or the like, and this helped obtain chips that were kink-free up to at least 30 mw.

Embodiment 2

Figure 11:
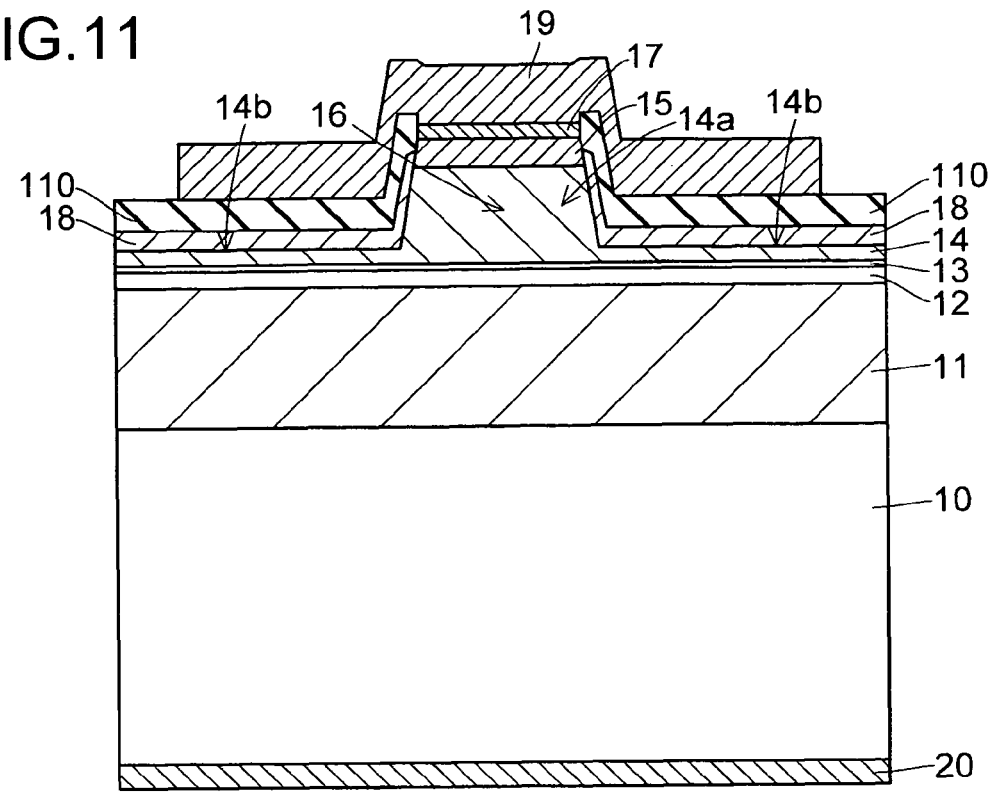
FIG. 11 is a sectional view of a nitride semiconductor laser chip according to Embodiment 2 of the invention.
Figure 12:
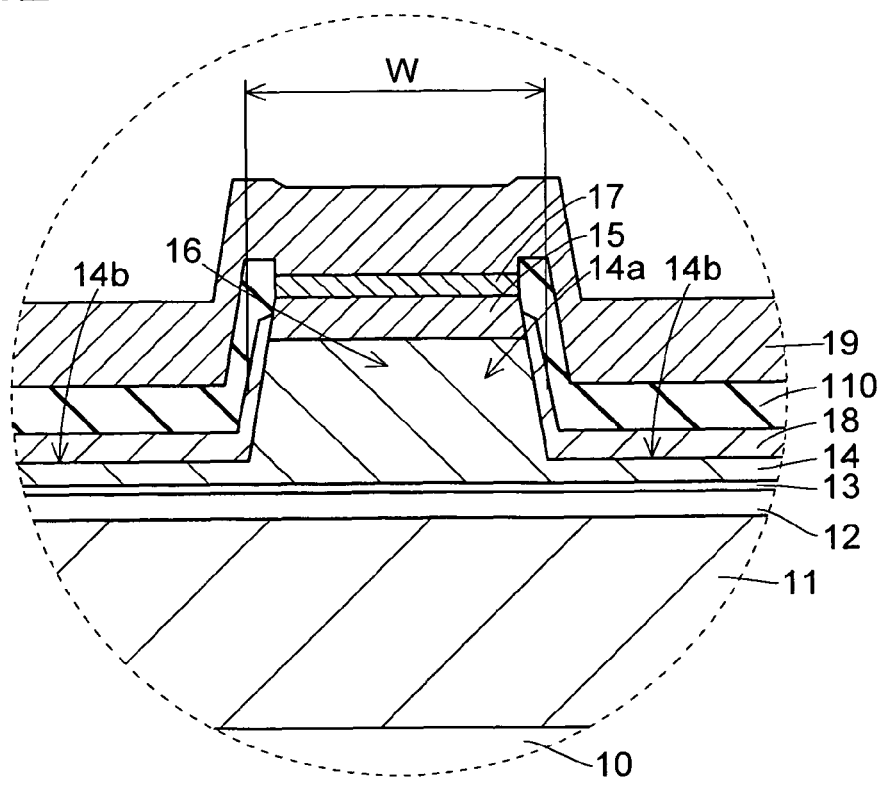
FIG. 12 is a sectional view of the nitride semiconductor laser chip according to Embodiment 2 of the invention (an enlarged sectional view of part of FIG. 11)

FIGS. 11 and 12 are sectional views of a nitride semiconductor laser chip according to a second embodiment (Embodiment 2) of the invention. Next, with reference to FIGS. 1, 11, and 12, the structure of the nitride semiconductor laser chip according to Embodiment 2 of the invention will be described. Among different drawings, corresponding components are identified by the same reference signs, and no overlapping description will be repeated unless necessary.

In Embodiment 1 described previously, as shown in FIG. 1, the p-side pad electrode 19 is formed in contact with the electrically conductive film 18, and this may cause one or more chips within a lot to have a low electrostatic withstand voltage. To cope with this, that is, to improve the electrostatic withstand voltage, in Embodiment 2, as shown in FIGS. 11 and 12, between the electrically conductive film 18 and the p-side pad electrode 19, an insulating film 110 is formed. That is, in Embodiment 2, on the electrically conductive film 18, an insulating film 110 is formed, and via this insulating film 110, the p-side pad electrode 19 is formed above the electrically conductive film 18.

Moreover, the insulating film 110 is formed of a $SiO_2$ film with a thickness of about 200 nm (2000 Å). It is preferable that the insulating film 110 be formed with a thickness of 100 nm or more. This structure provides a withstand voltage of 100 V or more.

Moreover, in Embodiment 2, the ridge portion 16 is given a ridge width W of about 2.5 μm.

Furthermore, in Embodiment 2, the electrically conductive film 18 is formed in a region excluding the top surface of the ridge portion 16. Specifically, the electrically conductive film 18 is formed so as to cover the region outside the ridge portion 16 (over the flat portion 14b of the p-type clad layer 14) and the side surface of the ridge portion 16. Then, on the electrically conductive film 18 formed in this way, the insulating film 110 is formed so as to cover the electrically conductive film 18.

Unlike in Embodiment 1, the p-side pad electrode 19 here has a multiple-layer structure (two-layer structure) in which, for example, a Ti layer (not shown) and a Au layer (not shown) are stacked sequentially from the insulating film 110 side. Moreover, on the top surface of the ridge portion 16, the contact electrode 17 is exposed, and the p-side pad electrode 19 is in direct contact with the exposed contact electrode 17.

As described above, in Embodiment 2, by forming the insulating film 110 on the electrically conductive film 18, and then forming the p-side pad electrode 19 above the electrically conductive film 18 via the insulating film 110 as described above, it is possible to improve the electrostatic withstand voltage, and thus to improve reliability. Moreover, it is possible to reduce variations within a lot, and thus it is possible to obtain semiconductor laser chips with high reliability at high yields.

In other respects, the benefits of Embodiment 2 are similar to those of Embodiment 1 described previously.

FIGS. 13 to 20 are sectional views illustrating a method of fabricating the nitride semiconductor laser chip according to Embodiment 2 of the invention. Next, with reference to FIGS. 3 and 10 to 20, a method of fabricating the nitride semiconductor laser chip according to Embodiment 2 of the invention will be described.

Figure 13:
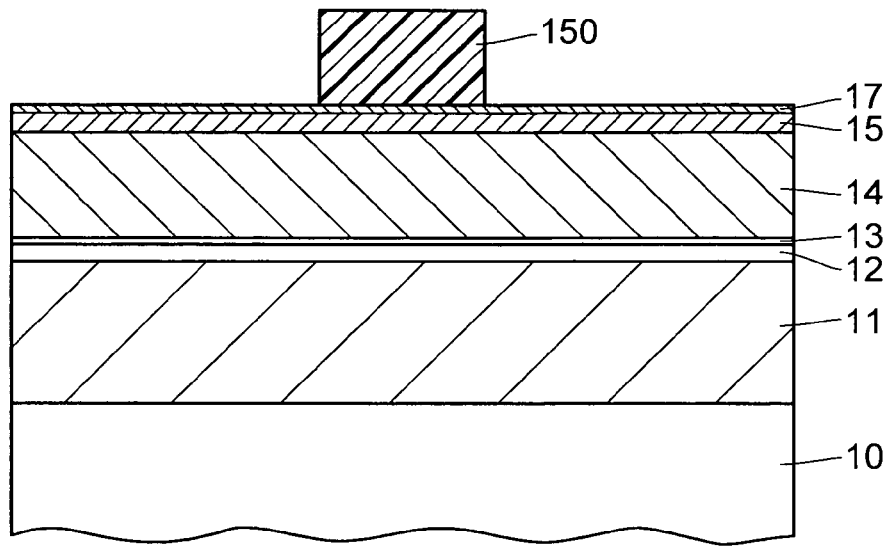
FIG. 13 is a sectional view illustrating a method of fabricating the nitride semiconductor laser chip according to Embodiment 2 of the invention.

First, as shown in FIG. 13, through a procedure similar to that in Embodiment 1 described previously, nitride semiconductor layers 11 to 15 are grown sequentially on an n-type GaN substrate 10, and thereafter, again in a similar manner, a contact electrode 17 is formed on the p-type contact layer 15.

Figure 14:
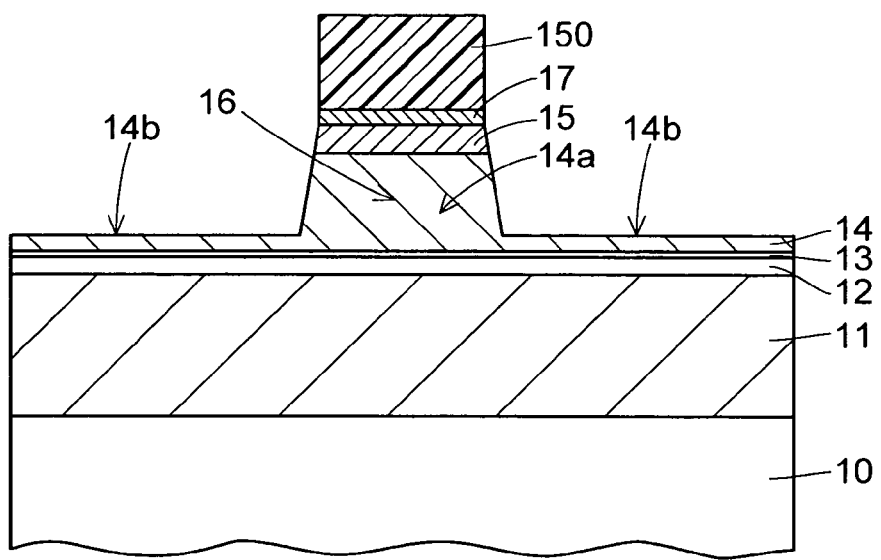
FIG. 14 is a sectional view illustrating the method of fabricating the nitride semiconductor laser chip according to Embodiment 2 of the invention.

Next, by a photolithography technology, in a predetermined region on the contact electrode 17, a resist layer 150 is formed. Then, as shown in FIG. 14, with the resist layer 150 used as a mask, by a dry-etching technology such as reactive ion etching, selective etching is performed from the top surface of the contact electrode 17 halfway into the depth of the p-type clad layer 14. This forms a stripe-shaped ridge portion 16 which is composed of an elevated portion 14a of the p-type clad layer 14 and the p-type contact layer 15, which has a ridge width W of about 2.5 μm, and which extends in the resonator direction (the Y direction; see FIG. 3), in practice a plurality of such ridge portions being formed parallel to one another.

Figure 15:
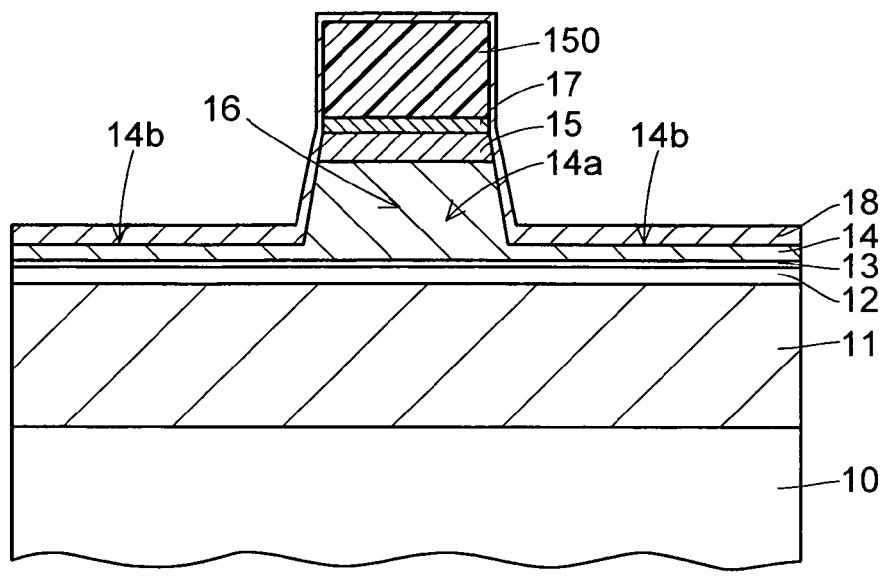
FIG. 15 is a sectional view illustrating the method of fabricating the nitride semiconductor laser chip according to Embodiment 2 of the invention.

Subsequently, as shown in FIG. 15, with the resist layer 150 remaining, by a sputtering process or an electron beam evaporation process, an electrically conductive film 18 is formed across the entire surface. Then, by lift-off, the resist layer 150 is removed, so that the contact electrode 17 over the ridge portion 16 is exposed.

Figure 16:
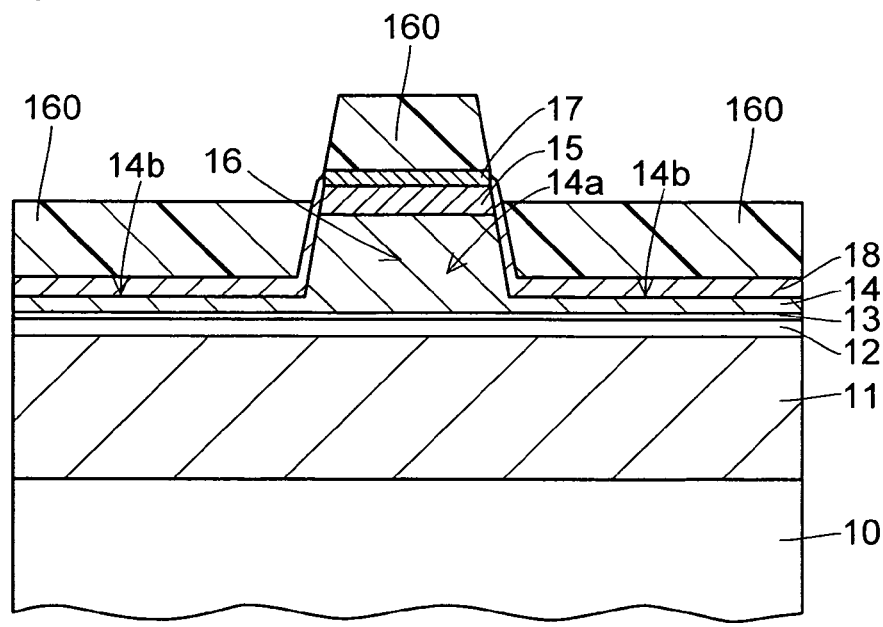
FIG. 16 is a sectional view illustrating the method of fabricating the nitride semiconductor laser chip according to Embodiment 2 of the invention.
Figure 17:
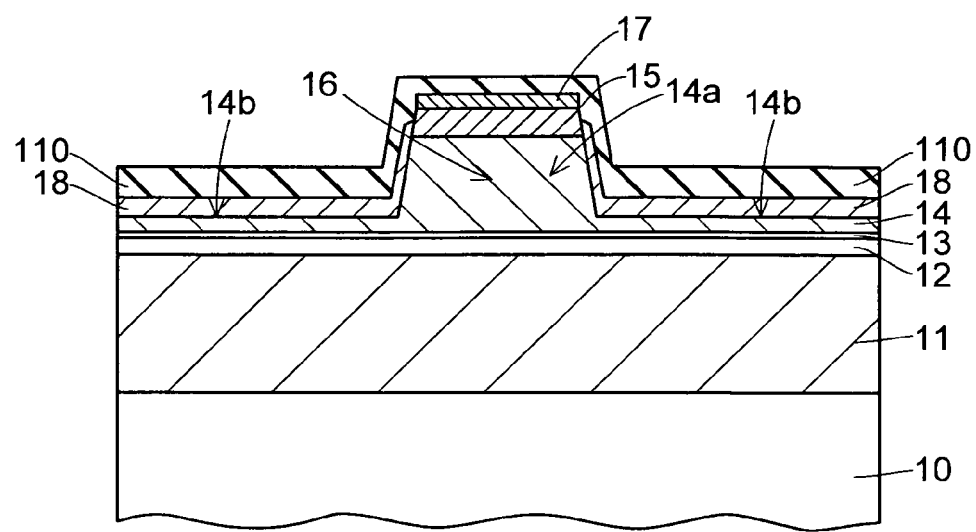
FIG. 17 is a sectional view illustrating the method of fabricating the nitride semiconductor laser chip according to Embodiment 2 of the invention.
Figure 18:
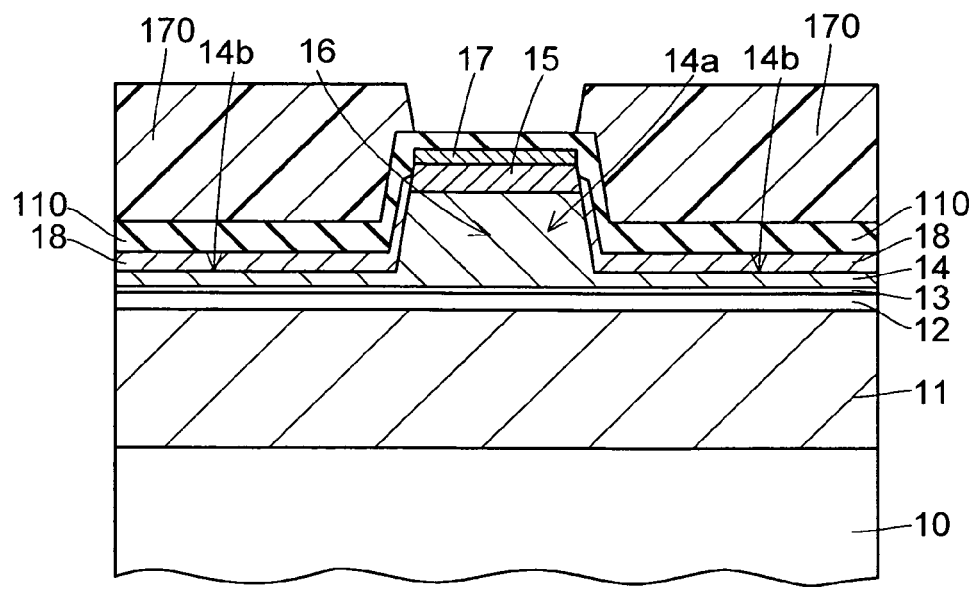
FIG. 18 is a sectional view illustrating the method of fabricating the nitride semiconductor laser chip according to Embodiment 2 of the invention.
Figure 19:
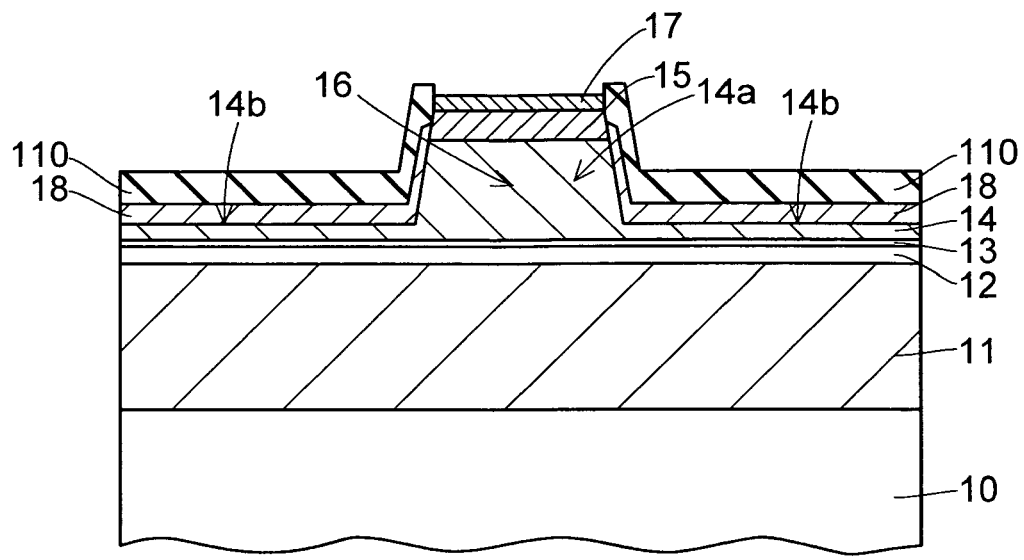
FIG. 19 is a sectional view illustrating the method of fabricating the nitride semiconductor laser chip according to Embodiment 2 of the invention.

Thereafter, as shown in FIG. 16, by a photolithography technology, a resist layer 160 is formed in such a way that part of the electrically conductive film 18 in an upper part of the side surface of the ridge portion 16 is exposed. Next, by a dry-etching process such as RIE, the exposed electrically conductive film 18 is removed. Then, the resist layer 160 is removed. Next, as shown in FIG. 17, across the entire top surface of the substrate including over the ridge portion 16, by a sputtering process or an electron beam evaporation process, an insulating film 110 of $SiO_2$ is formed with a thickness of about 200 nm. Subsequently, as show in FIG. 18, by a photolithography technology, a resist layer 170 is formed in such a way that only a part over the ridge portion 16 is exposed. Then, the part of the insulating film 110 over the ridge portion 16 is removed by use of, for example, an etching liquid based on a hydrofluoric acid. This leaves the electrically conductive film 18 and the insulating film 110 on either side of the ridge portion 16. Specifically, the electrically conductive film 18 is formed so as to cover the region outside the ridge portion 16 (over the flat portion 14b of the p-type clad layer 14) and the side surface of the ridge portion 16. Moreover, on this electrically conductive film 18, the insulating film 110 is formed so as to cover the electrically conductive film 18, and the electrically conductive film 18 is formed out of contact with the contact electrode 17 over the ridge portion 16.

Figure 20:
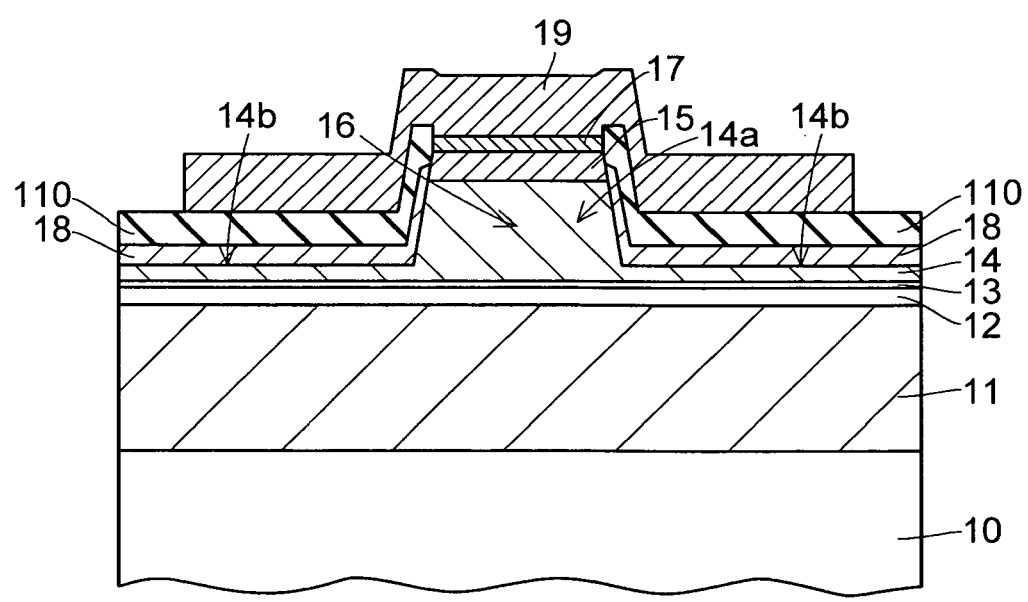
FIG. 20 is a sectional view illustrating the method of fabricating the nitride semiconductor laser chip according to Embodiment 2 of the invention.

Next, as shown in FIG. 20, by an electron beam evaporation process, a sputtering process, a plating process, or the like, on the insulating film 110, a p-side pad electrode 19 having a multiple-layer structure is formed by sequentially forming a Ti layer (not shown) and a Au layer (not shown) from the substrate (wafer) side.

Thereafter, through a procedure similar to that in Embodiment 1 described previously, the nitride semiconductor laser chip shown in FIGS. 11 and 12 according to Embodiment 2 of the invention is fabricated.

As in Embodiment 1, the nitride semiconductor laser chip fabricated in this way is then mounted on a stem via a submount of AlN, SiC, or the like, and is electrically connected to lead pins via wires. A cap is then welded on the stem, and this completes the assembly of a can-package semiconductor laser device.

By the fabrication method described above, nitride semiconductor laser chips similar to that of Embodiment 2 were fabricated, and their device characteristics were measured. These chips, compared with conventional chips with a ridge width of 1.5 μm, achieved an about 40% reduction in the operating resistance of an optical disc device and an about 10% reduction in the operating voltage. As a result, application of high-frequency superimposition was easier, and the cost of the high-frequency superimposition circuit was lower. Moreover, noise characteristics had less variations, and the cost of the optical pickup system was lower. Moreover, owing to the electrically conductive film being electrically isolated from the p-side pad electrode by the insulating film, the electrostatic withstand voltage was improved, achieving an electrostatic withstand voltage of 200 V or more. Furthermore, the leak current was reduced, and the yields were improved by 5%.

As in Embodiment 1, a plurality of nitride semiconductor laser chips with different ridge widths were fabricated, and the operating resistance of an optical disc device was measured. It was seen that, as the ridge width increased, the operating resistance tended to decrease. That is, Embodiment 2 yielded results similar to those shown in FIG. 10.

Also when the insulating film was formed of a material other than $SiO_2$, namely, an oxide or nitride of Ti, Si, Zr, or Al, it was possible to obtain benefits similar to those mentioned above.

Embodiment 3

Figure 21:
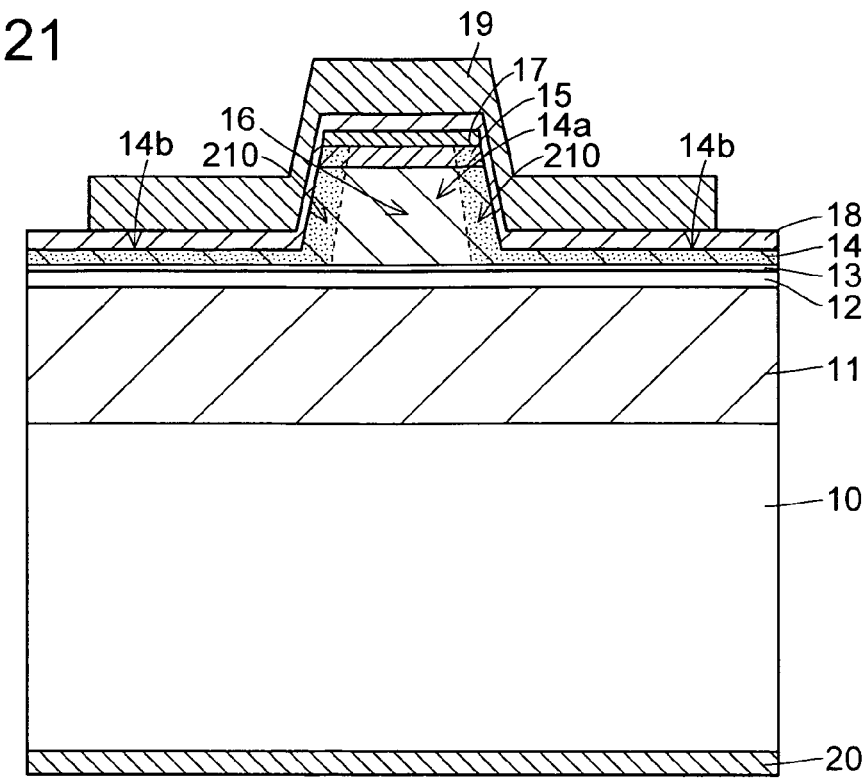
FIG. 21 is a sectional view of a nitride semiconductor laser chip according to Embodiment 3 of the invention.
Figure 22:
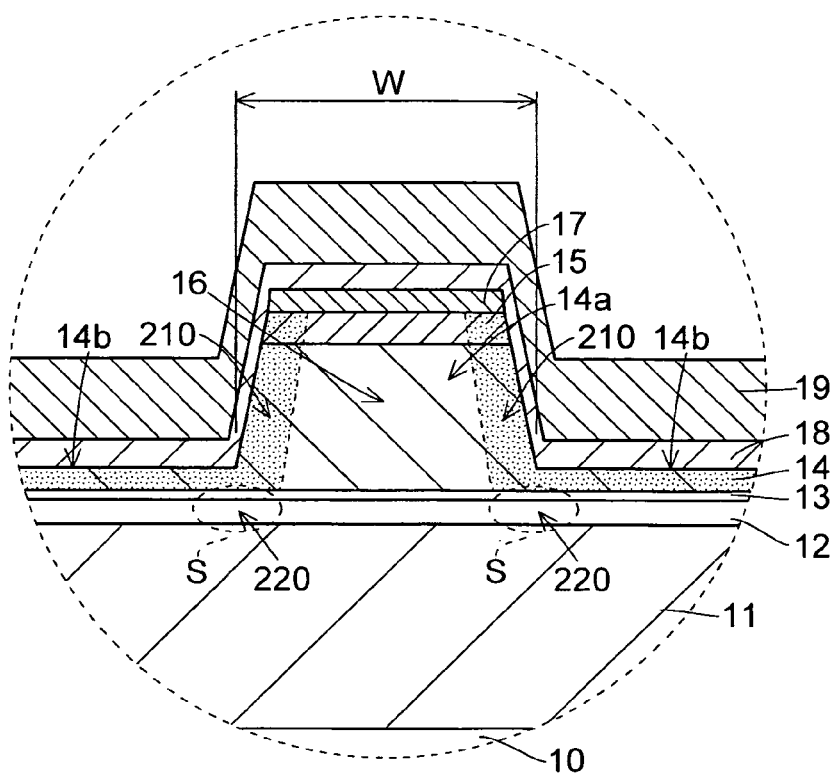
FIG. 22 is a sectional view of the nitride semiconductor laser chip according to Embodiment 3 of the invention (an enlarged sectional view of part of FIG. 21)
Figure 23:
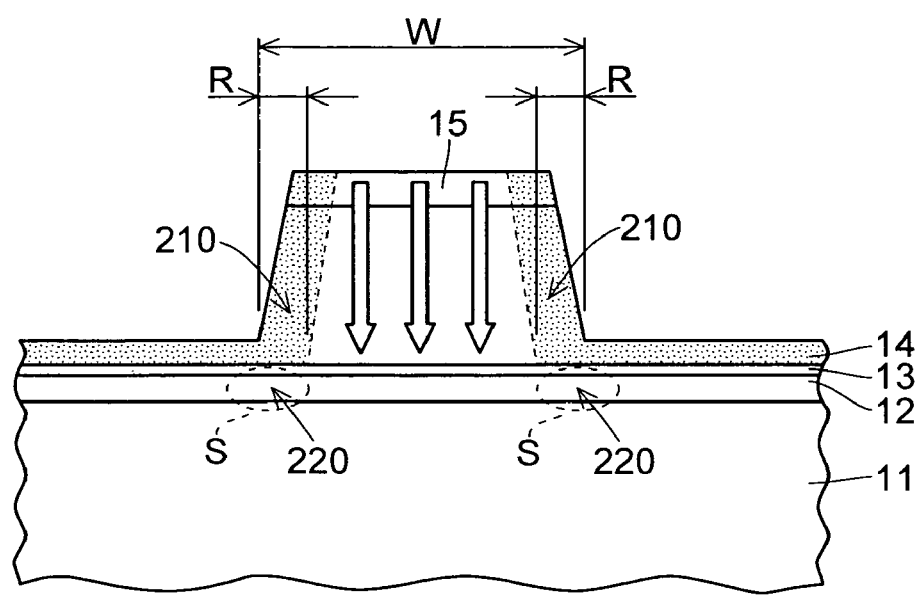
FIG. 23 is a sectional view illustrating the structure of the nitride semiconductor laser chip according to Embodiment 3 of the invention (a partly omitted diagram)

FIGS. 21 and 22 are sectional views of a nitride semiconductor laser chip according to a third embodiment (Embodiment 3) of the invention. FIG. 23 is a sectional view illustrating the structure of the nitride semiconductor laser chip according to Embodiment 3 of the invention. Next, with reference to FIGS. 21 to 23, the structure of the nitride semiconductor laser chip according to Embodiment 3 of the invention will be described. Among different drawings, corresponding components are identified by the same reference signs, and no overlapping description will be repeated unless necessary.

As shown in FIGS. 21 and 22, the nitride semiconductor laser chip according to Embodiment 3 differs in structure from that of Embodiment 1 described previously in that the carrier concentration on the p-type semiconductor layer surface at the side surface of the ridge portion 16 and the carrier concentration on the p-type semiconductor layer surface in the region outside the ridge portion 16 (the flat part of the p-type clad layer 14) are each $1\times10^{17}$ cm$^{-3}$ or less. That is, the carrier concentration on the p-type semiconductor layer surface in the region with which the electrically conductive film 18 is in contact is $1\times10^{17}$ cm$^{-3}$ or less. In other words, a region (high-resistance region 210) with a carrier concentration of $1\times10^{17}$ cm$^{-3}$ or less is formed in the region of the flat portion 14b of the p-type clad layer 14 and the region of the side surface of the ridge portion 16.

Moreover, the high-resistance region 210 is formed by being supplied with radical hydrogen from the p-type semiconductor layer surface. Thus, the hydrogen concentration on the p-type semiconductor layer surface at the side surface of the ridge portion 16 and the hydrogen concentration on the p-type semiconductor layer surface in the region outside the ridge portion 16 are each $1\times10^{18}$ cm$^{-3}$ or more. That is, the hydrogen concentration in the high-resistance region 210 is $1\times10^{18}$ cm$^{-3}$ or more. It is preferable that the high-resistance region 210 be configured to have a carrier concentration of $1\times10^{16}$ cm$^{-3}$ or less.

Here, the radical hydrogen supplied from the p-type semiconductor layer surface intrudes into the semiconductor layer through the surface of the p-type contact layer 15 and the p-type clad layer 14 (likewise, into the ridge portion 16 through the ridge surface), and diffuses in a range several micrometers beneath the surface. The radical hydrogen then bonds to active Mg in that range to become inactive, lowering the p-type carrier concentration. Thus, the high-resistance region 210 has a predetermined width (diffusion distance) inward from the p-type semiconductor layer surface.

Moreover, in Embodiment 3, as shown in FIG. 23, the high-resistance region 210 is so configured that its width R in the ridge portion 16 is 1 μm or less from each edge of the ridge portion 16.

Moreover, in Embodiment 3, the ridge portion 16 is given a ridge width W of about 4 μm.

Furthermore, in Embodiment 3, as a result of the high-resistance region 210 being formed, a saturable absorption region 220 is formed in the active layer 12. The saturable absorption region 220 is formed in a region (for example, parts S encircled by broken lines) that adjoins and has the same composition as the region of the active layer 12 where electric current is injected. Specifically, the high-resistance region 210 is a region where the p-type carrier concentration is reduced as a result of passivation of hydrogen, and thus has an extremely high resistance. This makes it difficult for electric current to pass through the high-resistance region 210. Thus, the current injection width is restricted within the ridge portion 16 (within the ridge waveguide), and accordingly the region (see hollow arrows in FIG. 23) across which electric current passes is narrower than the waveguide width when the high-resistance region 210 is not formed. That is, the region across which electric current passes has a width of (Ridge Width—2) μm or more. The light produced in the active layer 12 spreads within the waveguide, and thus in the active layer 12, while no electric current is injected, a region (the saturable absorption region 220) is formed where light distributes.

As described above, the nitride semiconductor laser chip according to Embodiment 3 is a nitride semiconductor laser chip of a self-exciting oscillation type in which a saturable absorption region 220 is formed.

As described above, in Embodiment 3, by making the carrier concentration on the p-type semiconductor layer surface (the p-type clad layer 14 and the p-type contact layer 15) at the side surface of the ridge portion 16 and the carrier concentration on the p-type semiconductor layer surface (the surface of the flat portion 14b of the p-type clad layer 14) in the region outside the ridge portion 16 each equal to $1\times10^{17}$ cm$^{-3}$ or less, it is possible to put the electrically conductive film 18 in non-ohmic contact with the region outside the ridge portion on the p-type clad layer 14 (over the flat portion 14b of the p-type clad layer 14) and the side surface of the ridge portion 16. Thus, even though the electrically conductive film 18 is in contact with a nitride semiconductor layer such as the p-type clad layer 14, it is possible to further suppress passage of electric current across the contact region, and thus to further suppress leak current.

By making the carrier concentration on the p-type semiconductor layer surface at the side surface of the ridge portion 16 and the carrier concentration on the p-type semiconductor layer surface in the region outside the ridge portion 16 each equal to $1\times10^{16}$ cm$^{-3}$ or less, it is possible to suppress leak current more effectively.

Moreover, in Embodiment 3, by supplying radical hydrogen to the p-type semiconductor layer surface, it is possible to easily make the carrier concentration on the p-type semiconductor layer surface at the side surface of the ridge portion 16 and the carrier concentration on the p-type semiconductor layer surface in the region outside the ridge portion 16 equal to $1\times10^{17}$ cm$^{-3}$ ($1\times10^{16}$ cm$^{-3}$) or less.

Furthermore, in Embodiment 3, by making the width R of the region in the ridge portion 16 (the high-resistance region 210) where the carrier concentration on the p-type semiconductor layer surface is $1\times10^{17}$ cm$^{-3}$ equal to 1 μm or less from each edge, it is possible to form a saturable absorption region 220 in the active layer 12, and thus it is possible to let the nitride semiconductor laser chip oscillate by self-excitation. This eliminates the need for a high-frequency superimposition circuit, and thus helps achieve further cost reduction.

In other respects, the benefits of Embodiment 3 are similar to those of Embodiment 1 described previously.

FIGS. 24 to 27 are sectional views illustrating a method of fabricating the nitride semiconductor laser chip according to Embodiment 3 of the invention. Next, with reference to FIGS. 21 and 24 to 27, a method of fabricating the nitride semiconductor laser chip according to Embodiment 3 of the invention will be described.

Figure 24:
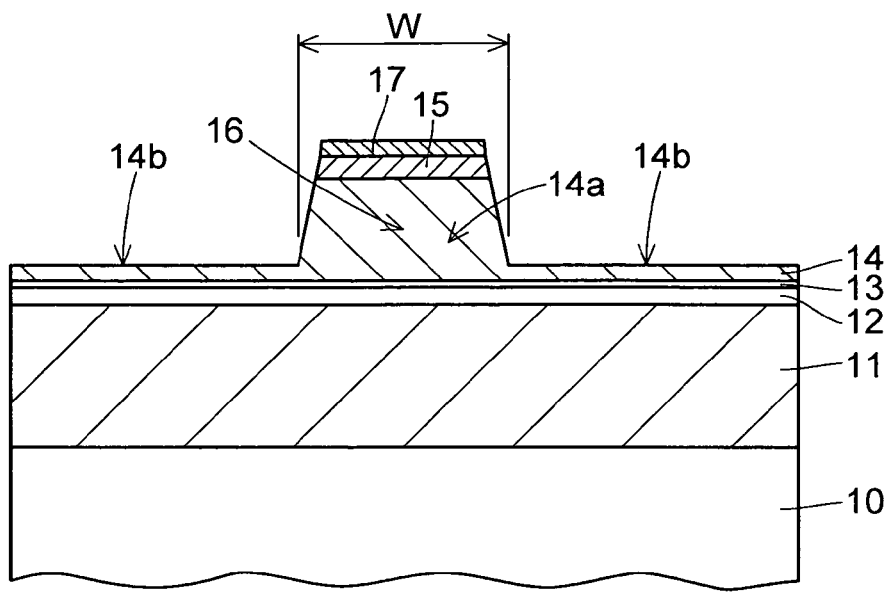
FIG. 24 is a sectional view illustrating a method of fabricating the nitride semiconductor laser chip according to Embodiment 3 of the invention.

As shown in FIG. 24, through a procedure similar to that in Embodiments 1 and 2 described previously, a ridge portion 16 is formed. Here, the ridge portion 16 is formed with a ridge width W of about 4 μm.

Figure 25:
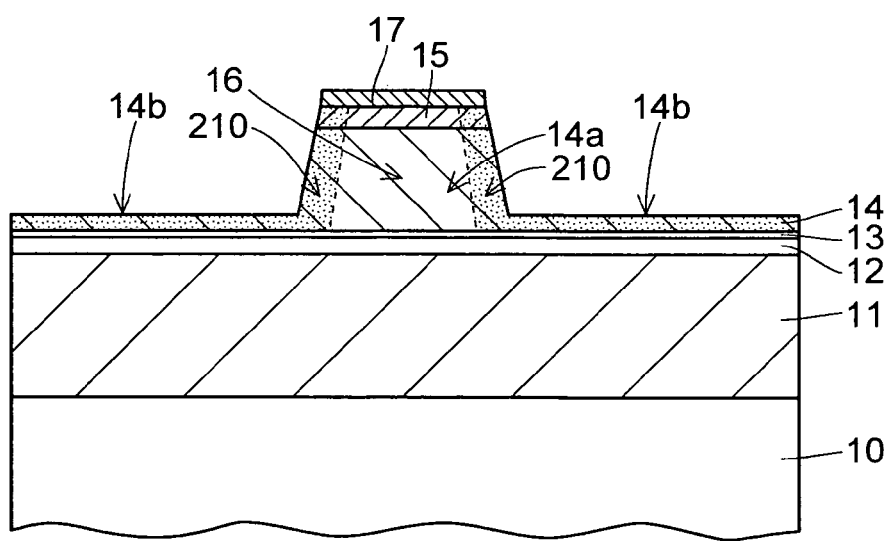
FIG. 25 is a sectional view illustrating the method of fabricating the nitride semiconductor laser chip according to Embodiment 3 of the invention.

Next, as shown in FIG. 25, the surface is blasted with radical hydrogen from a radical hydrogen source. Since the contact electrode 17 is formed on the ridge portion 16, the contact electrode 17 serves as a mask so that radical hydrogen is supplied to the region elsewhere than there. Moreover, as described above, the radical hydrogen intrudes into the semiconductor layer through the surface of the p-type contact layer 15 of p-type GaN and through the surface of the p-type clad layer 14 of p-type AlGaN (likewise, into the ridge portion 16 through the ridge surface), and diffuses in a range several micrometers beneath the surface. The radical hydrogen then bonds with active Mg in that range to become inactive, lowering the p-type carrier concentration.

Here, the diffusion distance of radical hydrogen can be controlled by controlling the conditions under which radical hydrogen is supplied from the radical hydrogen source (such as the amount of hydrogen supplied, the temperature and length of the hydrogen cracking zone, the supply duration, etc.).

In Embodiment 3, hydrogen is supplied under the following conditions so that radical hydrogen diffuses over a distance of about 1 μm: the amount of hydrogen supplied, 1 sccm; the temperature of the hydrogen cracking zone, 1100° C.; the length of the same zone (the length of the region for generation of radical hydrogen by the radical hydrogen source), 300 mm; and the supply duration, 10 minutes. This forms the diffusion region (high-resistance region 210) where radical hydrogen is diffused.

Figure 26:
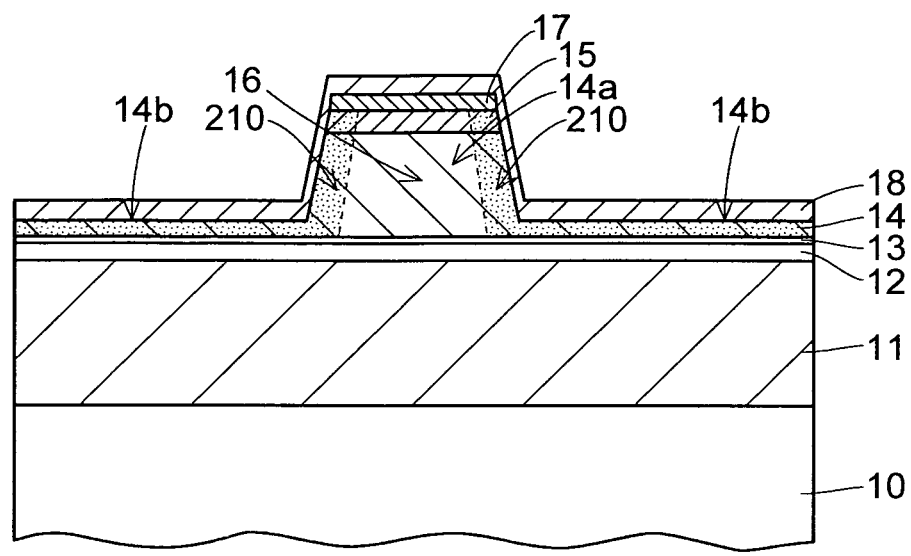
FIG. 26 is a sectional view illustrating the method of fabricating the nitride semiconductor laser chip according to Embodiment 3 of the invention.

Next, as shown in FIG. 26, by a sputtering process or an electron beam evaporation process, an electrically conductive film 18 is formed so as to cover the top surface of the ridge portion 16 (over the contact electrode 17), the side surface of the ridge portion 16, and the region outside the ridge portion 16 (over the flat portion 14b of the p-type clad layer 14). That is, across the entire surface over the p-type clad layer 14, the electrically conductive film 18 is formed in direct contact with the p-type clad layer 14. The electrically conductive film 18 is formed of, for example, Ti, Pd, Ni, W, Mo, or the like, and is given a thickness of, for example, about 10 nm to about 20 nm.

Figure 27:
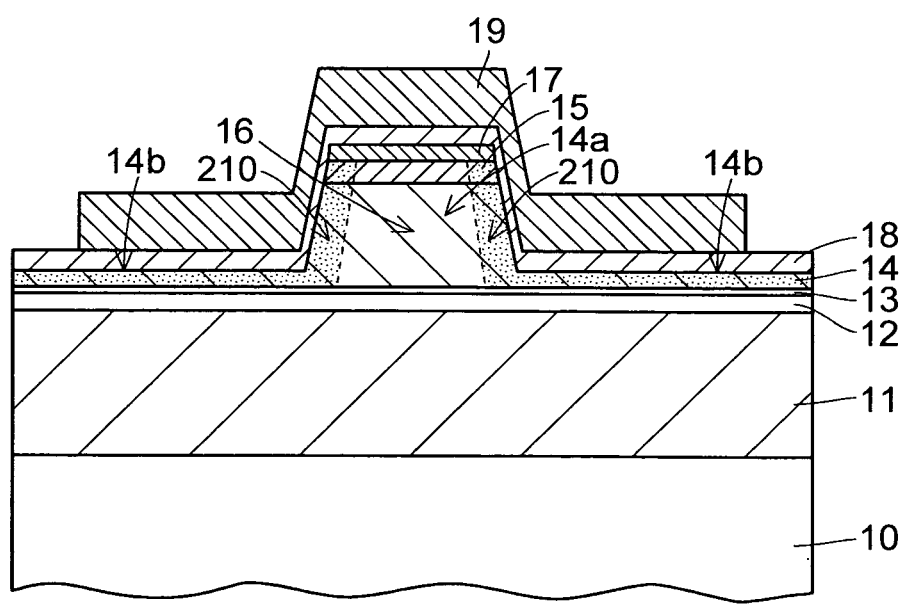
FIG. 27 is a sectional view illustrating the method of fabricating the nitride semiconductor laser chip according to Embodiment 3 of the invention.

Subsequently, as shown in FIG. 27, by a sputtering process, an electron beam evaporation process, a plating process, or the like, on the electrically conductive film 18, an Au layer is formed as a p-side pad electrode 19.

Thereafter, through a procedure similar to that in Embodiment 1 described previously, the nitride semiconductor laser chip shown in FIG. 21 according to Embodiment 3 of the invention is fabricated.

The nitride semiconductor laser chip fabricated in this way is then mounted on a stem via a sub-mount of AlN, SiC, or the like, and is electrically connected to lead pins via wires. A cap is then welded on the stem, and this completes the assembly of a can-package semiconductor laser device.

By the fabrication method described above, nitride semiconductor laser chips similar to that of Embodiment 3 were fabricated, and their device characteristics were measured. These chips, compared with conventional chips with a ridge width of 1.5 μm, achieved an about 30% reduction in the operating resistance of an optical disc device. In addition, owing to the saturable absorption region being formed in the active layer, they oscillated by self-excitation; this eliminated the need for a high-frequency superimposition circuit, and helped further reduce the cost of the optical pickup system.

It should be understood that the embodiments presented above are in every way merely illustrative and not restrictive. The scope of the present invention is defined not by the description of the embodiments presented above but by the scope of the appended claims, and encompasses any variations and modifications made within the sense and range equivalent to those of the claims.

For example, although Embodiments 1 to 3 described above deal with examples where the side surface of the ridge portion too are covered by the electrically conductive film, this is not meant to limit the invention; the electrically conductive film does not necessarily have to be formed on the side surface of the ridge portion. That is, the electrically conductive film has only to be formed at least in a region outside the ridge portion on the nitride semiconductor layer (p-type clad layer).

Although Embodiments 1 to 3 described above deal with examples where an electrically conductive film of Ti, Pd, Ni, W, Mo, or the like is formed on the p-type clad layer, this is not meant to limit the invention; the electrically conductive film may be formed of a material other than those just mentioned. Specifically, the electrically conductive film may be formed of, for example, a material containing at least one element selected from the group consisting of Ti, Mo, Ni, Cr, Cu, Fe, Zr, Hf, Nb, W, Rh, Ru, Mg, Si, Al, Sc, Y, Ta, Co, Pd, Ag, Au, and Pt.

Although Embodiments 1 to 3 described above deal with examples where the ridge portion has a ridge width that is uniform in the resonator direction, this is not meant to limit the invention; the ridge portion may be formed with a ridge width that varies locally along the resonator direction. In that case, the average value of the widths varying along the entire resonator length as measured along the bottom edge can be taken as the ridge width.

In Embodiments 1 to 3 described above, the ridge width of the ridge portion may be changed as desired within a range of 2 μm or more but 6 μm or less.

Although Embodiments 1 to 3 described above deal with examples where an n-type GaN substrate is used as the substrate, this is not meant to limit the invention; it is possible to use instead an electrically conductive substrate of InGaN, AlGaN, AlGaInN, or the like. It is possible to use, other than electrically conductive substrates, an insulating substrate such as a sapphire substrate. The thicknesses, compositions, etc. of individual nitride semiconductor layers formed by crystal growth above the substrate may be combined or changed appropriately to suit the desired characteristics. For example, one or more semiconductor layers may be added or omitted, or the order of semiconductor layers may be partly changed. The conductivity type of one or more semiconductor layers may be changed. That is, any modification can be made so long as the basic characteristics of a nitride semiconductor laser chip can be obtained.

Although Embodiments 1 to 3 described above deal with examples where individual nitride semiconductor layers are formed on the substrate by crystal growth using an MOCVD process, this is not meant to limit the invention; individual nitride semiconductor layers may be formed on the substrate by crystal growth using any vapor-phase growth process other than an MOCVD process, for example an MBE (molecular beam epitaxy) process, an HDVPE (hydride vapor phase epitaxy) process, etc.

Although Embodiment 2 described above deals with an example where an insulating film of $SiO_2$ is formed on the electrically conductive film, this is not meant to limit the invention; an insulating film of any insulating material other than $SiO_2$ may be formed on the electrically conductive film. For example, an insulating film of an oxide or nitride of Ti, Si, Zr, or Al may be formed on the electrically conductive film.

Although Embodiment 3 described above deals with an example where the semiconductor layer is blasted with radical hydrogen to supply the semiconductor layer surface with hydrogen, this is not meant to limit the invention; the semiconductor layer surface may be supplied with hydrogen by hydrogen implantation. Also with this scheme, it is possible to obtain similar benefits.

Although Embodiment 3 described above deals with an example where the region (high-resistance region) in the ridge portion where the carrier concentration on the p-type semiconductor surface is $1 \times 10^{17}$ $cm^{-3}$ or less occupies 1 μm or less from each edge of the ridge portion, the width of this region (the diffusion distance) may be changed appropriately with consideration given to the ridge width etc. It is preferable that the width of the just-mentioned region (the diffusion distance) be, in total, 2 μm or less, or 25% or less of the ridge width. With this structure, it is possible to form a saturable absorption region in the active layer, and thus to achieve self-exciting oscillation.

The structures of Embodiments 1 to 3 described above may be combined appropriately. Embodiments realized by combining together appropriate ones of the features descried above are within the technical scope of the present invention.

What is claimed is:

1. A nitride semiconductor laser chip comprising:
   an active layer comprising a nitride semiconductor;
   a nitride semiconductor layer above the active layer and comprising a p-type nitride semiconductor;
   a ridge portion formed in a part of the nitride semiconductor layer; and
   an electrically conductive film above the nitride semiconductor layer and having a light-absorbing property,
   wherein the electrically conductive film is at least in a region outside the ridge portion and in contact with the ridge portion,
   wherein a carrier concentration on a surface of the nitride semiconductor layer at a side surface of the ridge portion and a carrier concentration on a surface of the nitride semiconductor layer in a region outside the ridge portion are both $1\times10^{17}$ cm$^{-3}$ or less, and
   wherein the ridge portion has a ridge width of about 2 μm to about 6 μm.

2. The nitride semiconductor laser chip according to claim 1,
   wherein the electrically conductive film covers the region outside the ridge portion above the nitride semiconductor layer and a side surface of the ridge portion.

3. The nitride semiconductor laser chip according to claim 1,
   wherein the carrier concentration on the surface of the nitride semiconductor layer at the side surface of the ridge portion and the carrier concentration on the surface of the nitride semiconductor layer in the region outside the ridge portion are both $1\times10^{16}$ cm$^{-3}$ or less.

4. The nitride semiconductor laser chip according to claim 1,
   wherein the electrically conductive film has a thickness of about 15 nm to about 100 nm.

5. The nitride semiconductor laser chip according to claim 1,
   wherein the electrically conductive film comprises at least one element selected from the group consisting of Ti, Mo, Ni, Cr, Cu, Fe, Zr, Hf, Nb, W, Rh, Ru, Mg, Si, Al, Sc, Y, Ta, Co, Pd, Ag, Au, and Pt.

6. The nitride semiconductor laser chip according to claim 1,
   further comprising an insulating film on the electrically conductive film, and
   an electrode layer above the insulating film on the electrically conductive film.

7. The nitride semiconductor laser chip according to claim 6,
   wherein the insulating film is an oxide or nitride of Ti, Si, Zr, or Al.

8. The nitride semiconductor laser chip according to claim 1,
   wherein the nitride semiconductor layer comprises Mg as a p-type dopant.

9. The nitride semiconductor laser chip according to claim 8,
   wherein a surface of the nitride semiconductor layer is supplied with hydrogen, and
   wherein a hydrogen concentration on the surface of the nitride semiconductor layer at the side surface of the ridge portion and a hydrogen concentration on the surface of the nitride semiconductor layer in the region outside the ridge portion are both $1\times10^{18}$ cm$^{-3}$ or more.

10. The nitride semiconductor laser chip according to claim 1,
    wherein a region in the ridge portion where the carrier concentration on the surface of the nitride semiconductor layer is $1\times10^{17}$ cm$^{-3}$ or less has a width of 2 μm or less, or 25% or less of the ridge width.

* * * * *